US009686877B2

(12) United States Patent
Tokumasu et al.

(10) Patent No.: US 9,686,877 B2
(45) Date of Patent: Jun. 20, 2017

(54) LOCKING STRUCTURE BETWEEN MEMBER TO BE SUPPORTED AND SUPPORTING BODY

(71) Applicant: YAZAKI CORPORATION, Tokyo (JP)

(72) Inventors: Yasuhiro Tokumasu, Shizuoka (JP); Hiroki Shiraiwa, Shizuoka (JP); Kazuomi Kiyosue, Shizuoka (JP); Pharima Akanitsuk, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 145 days.

(21) Appl. No.: 14/691,820

(22) Filed: Apr. 21, 2015

(65) Prior Publication Data

US 2015/0305184 A1    Oct. 22, 2015

(30) Foreign Application Priority Data

Apr. 21, 2014    (JP) ................................. 2014-087540

(51) Int. Cl.
  *H05K 5/02*    (2006.01)
  *H05K 5/00*    (2006.01)

(52) U.S. Cl.
  CPC ......... *H05K 5/0221* (2013.01); *H05K 5/0052* (2013.01)

(58) Field of Classification Search
  CPC ............ B60R 16/0238; B60R 16/0239; H02G 3/081; H02G 3/088; H02G 3/086;
  (Continued)

(56) References Cited

U.S. PATENT DOCUMENTS 5,822,189 A * 10/1998 Isshiki ................. H01R 9/2425
                                                         174/59
6,077,102 A *  6/2000 Borzi .................... H01R 9/2458
                                                         439/364
(Continued)

FOREIGN PATENT DOCUMENTS

CN        2520027 Y    11/2002
CN        1645679 A     7/2005
(Continued)

OTHER PUBLICATIONS

Communication dated Feb. 4, 2017 from the State Intellectual Property Office of the P.R.C. In counterpart Application No. 201510187991.3.

*Primary Examiner* — James Ference
(74) *Attorney, Agent, or Firm* — Sughrue Mion, PLLC

(57) ABSTRACT

A locking structure between a member to be supported and a supporting body includes an electronic component unit as a member to be supported, an electronic component unit housing part of an electrical connection box as a supporting body, a lock mechanism for upper insertion fitting (an engagement claw and a lock arm) that, when the electronic component unit is fitted to the electronic component unit housing part from an upper-side opening, locks the electronic component unit to the electronic component unit housing part to prevent the electronic component unit from escaping toward the upper-side opening, and a lock mechanism for lower insertion fitting (an engagement claw and a lock arm) that, when the electronic component unit is fitted to the electronic component unit housing part from a lower-side opening, locks the electronic component unit to the electronic component unit housing part to prevent from escaping toward the lower-side opening.

11 Claims, 12 Drawing Sheets

(58) Field of Classification Search
CPC .... H05K 7/026; H05K 5/0221; H05K 5/0052; H05K 1/144; H01R 13/506
See application file for complete search history.

(56) References Cited

U.S. PATENT DOCUMENTS

| | | | |
|---|---|---|---|
| 6,524,136 B2* | 2/2003 | Kawaguchi | B60R 16/0239 439/620.26 |
| 6,545,217 B2* | 4/2003 | Sato | H02G 3/088 174/135 |
| 6,570,088 B1* | 5/2003 | Depp | B60R 16/0238 174/50 |
| 6,761,567 B2* | 7/2004 | Onizuka | B60R 16/0238 439/76.2 |
| 6,870,097 B2* | 3/2005 | Oda | B60R 16/0238 174/50 |
| 6,922,332 B2* | 7/2005 | Naimi | B60R 16/0238 361/641 |
| 6,923,660 B2* | 8/2005 | Takeuchi | H01R 13/506 439/76.2 |
| 7,053,298 B2* | 5/2006 | Ikeda | B60R 16/0238 174/50 |
| 7,168,962 B2* | 1/2007 | Yomura | H01R 9/226 439/76.2 |
| 7,193,841 B2* | 3/2007 | Kita | B60R 16/0239 361/641 |
| 7,321,096 B1* | 1/2008 | Huang | G03B 17/02 174/135 |
| 7,321,286 B2* | 1/2008 | Nojima | H01H 85/205 337/186 |
| 7,357,649 B2* | 4/2008 | Asao | H05K 7/026 439/76.2 |
| 7,429,700 B2* | 9/2008 | Kanamaru | H01R 13/506 174/135 |
| 7,465,172 B2* | 12/2008 | Ishiguro | H05K 1/0266 174/50 |
| 7,544,887 B2* | 6/2009 | Iizuka | H02G 3/081 174/135 |
| 7,549,873 B2* | 6/2009 | Hayakawa | H05K 7/026 439/34 |
| 7,575,472 B1 | 8/2009 | Wu | |
| 7,632,110 B2* | 12/2009 | Kanou | B60R 16/0239 361/704 |
| 7,642,456 B2* | 1/2010 | Baba | H01H 85/2045 174/17 R |
| 7,670,184 B2* | 3/2010 | Akahori | B60R 16/0238 439/620.27 |
| 7,671,608 B2* | 3/2010 | Oda | G01R 31/045 324/538 |
| 7,682,183 B2* | 3/2010 | Kanazawa | H01R 9/2408 439/357 |
| 7,699,623 B2* | 4/2010 | Yoshida | H02G 3/081 174/50 |
| 7,771,212 B2* | 8/2010 | Miyamoto | H05K 7/026 439/76.2 |
| 7,826,232 B2 | 11/2010 | Von Arx et al. | |
| 7,837,480 B2* | 11/2010 | Akahori | B60R 16/0238 439/76.2 |
| 7,931,478 B2* | 4/2011 | Yamaguchi | H05K 5/061 361/752 |
| 8,035,040 B2* | 10/2011 | Nishikawa | B60R 16/0238 174/541 |
| 8,162,675 B2 | 4/2012 | Regnier et al. | |
| 8,163,994 B2* | 4/2012 | Taniguchi | H02G 3/081 174/50 |
| 8,187,019 B2 | 5/2012 | Reed et al. | |
| 8,226,441 B2 | 7/2012 | Regnier et al. | |
| 8,231,404 B2* | 7/2012 | Ikeda | B60R 16/0238 439/540.1 |
| 8,241,045 B2 | 8/2012 | Reed et al. | |
| 8,257,097 B2* | 9/2012 | Kawaguchi | B60R 16/0238 439/76.2 |
| 8,342,881 B2 | 1/2013 | Lang et al. | |
| 8,378,235 B2* | 2/2013 | Matsui | H05K 7/026 174/541 |
| 8,410,361 B2* | 4/2013 | Kita | B60R 16/0238 174/58 |
| 8,414,324 B2 | 4/2013 | Reed et al. | |
| 8,425,238 B2* | 4/2013 | Takeuchi | B60R 16/0238 439/76.2 |
| 8,439,704 B2 | 5/2013 | Reed | |
| 8,449,312 B2 | 5/2013 | Lang et al. | |
| 8,460,033 B2 | 6/2013 | Regnier et al. | |
| 8,465,302 B2 | 6/2013 | Regnier et al. | |
| 8,573,997 B2 | 11/2013 | Neer et al. | |
| 8,597,055 B2 | 12/2013 | Regnier et al. | |
| 8,678,839 B2 | 3/2014 | Reed et al. | |
| 8,740,646 B2 | 6/2014 | Lang et al. | |
| 8,753,145 B2 | 6/2014 | Lang et al. | |
| 8,821,168 B2 | 9/2014 | Reed et al. | |
| 9,461,392 B2 | 10/2016 | Regnier et al. | |
| 2002/0180272 A1* | 12/2002 | Yuasa | B60R 16/0238 307/10.1 |
| 2004/0109260 A1* | 6/2004 | Kim | G11B 15/6656 360/96.51 |
| 2005/0153583 A1* | 7/2005 | Kawamura | H01R 9/2458 439/76.2 |
| 2005/0181666 A1 | 8/2005 | Shimizu et al. | |
| 2005/0194167 A1* | 9/2005 | Kiyota | H02G 3/081 174/17 VA |
| 2006/0205249 A1* | 9/2006 | Higuchi | H01H 85/044 439/76.2 |
| 2007/0173092 A1* | 7/2007 | Von Arx | H01R 13/514 439/188 |
| 2008/0090426 A1 | 4/2008 | Lutsch et al. | |
| 2008/0149387 A1* | 6/2008 | Oda | H05K 7/026 174/520 |
| 2008/0247133 A1* | 10/2008 | Ito | H01H 50/021 361/730 |
| 2008/0268671 A1* | 10/2008 | Harris | H01H 85/046 439/76.2 |
| 2008/0310121 A1* | 12/2008 | Yamashita | H01R 9/226 361/720 |
| 2009/0163053 A1* | 6/2009 | Yamaguchi | H01R 9/2466 439/76.1 |
| 2009/0253311 A1* | 10/2009 | Akahori | B60R 16/0238 439/709 |
| 2011/0212633 A1 | 9/2011 | Regnier et al. | |
| 2011/0212643 A1 | 9/2011 | Reed et al. | |
| 2011/0223805 A1 | 9/2011 | Regnier et al. | |
| 2011/0223809 A1 | 9/2011 | Reed et al. | |
| 2011/0223810 A1 | 9/2011 | Regnier et al. | |
| 2011/0230104 A1 | 9/2011 | Lang et al. | |
| 2011/0256776 A1 | 10/2011 | Reed | |
| 2011/0269338 A1 | 11/2011 | Lang et al. | |
| 2011/0294347 A1 | 12/2011 | Lang et al. | |
| 2012/0000686 A1* | 1/2012 | Soh | B60R 16/0239 174/50 |
| 2012/0064741 A1* | 3/2012 | Kawaguchi | H05K 5/0026 439/76.2 |
| 2012/0119041 A1* | 5/2012 | Ikehata | H02G 3/16 248/201 |
| 2012/0132454 A1* | 5/2012 | Miyamoto | B60R 16/0238 174/50 |
| 2012/0214327 A1 | 8/2012 | Reed et al. | |
| 2012/0264325 A1 | 10/2012 | Reed et al. | |
| 2012/0307464 A1* | 12/2012 | Nakanishi | B60R 16/0238 361/752 |
| 2012/0327620 A1* | 12/2012 | Hara | H05K 7/026 361/759 |
| 2013/0005173 A1 | 1/2013 | Reed et al. | |
| 2013/0072062 A1 | 3/2013 | Regnier et al. | |
| 2013/0082048 A1* | 4/2013 | Hirasawa | H01R 13/73 220/3.9 |
| 2013/0157512 A1 | 6/2013 | Regnier et al. | |
| 2013/0189876 A1 | 7/2013 | Lang et al. | |
| 2013/0250489 A1* | 9/2013 | Toda | H02B 1/20 361/648 |

(56) References Cited

U.S. PATENT DOCUMENTS

| | | | |
|---|---|---|---|
| 2013/0343018 A1* | 12/2013 | Hattori | H05K 5/0065 361/755 |
| 2014/0111908 A1* | 4/2014 | Ewing | G06F 1/189 361/626 |
| 2014/0170887 A1 | 6/2014 | Reed et al. | |
| 2014/0335736 A1 | 11/2014 | Regnier et al. | |
| 2017/0018894 A1 | 1/2017 | Regnier et al. | |

FOREIGN PATENT DOCUMENTS

| | | |
|---|---|---|
| CN | 2829130 Y | 10/2006 |
| CN | 101667698 A | 3/2010 |
| CN | 201562815 U | 8/2010 |
| CN | 103326212 A | 9/2013 |
| EP | 1 912 293 A1 | 4/2008 |
| JP | 2013-198347 A | 9/2013 |

* cited by examiner

LOCKING STRUCTURE BETWEEN MEMBER TO BE SUPPORTED AND SUPPORTING BODY

CROSS-REFERENCE TO RELATED APPLICATIONS

The present application claims priority to and incorporates by reference the entire contents of Japanese Patent Application No. 2014-087540 filed in Japan on Apr. 21, 2014.

BACKGROUND OF THE INVENTION

1. Field of the Invention

The present invention relates to a locking structure between a member to be supported and a supporting body.

2. Description of the Related Art

Japanese Patent Application Laid-open No. 2013-198347, for example, discloses, as a locking structure for locking a member to be supported to a supporting body, a configuration that provides a locking part on the outer face of a peripheral wall of an electronic component module (the member to be supported) housed within an electrical connection box (the supporting body) installed in a vehicle or the like and locks the electronic component module to the electrical connection box through the locking part.

However, the conventional locking structure between a member to be supported and a supporting body disclosed in Japanese Patent Application Laid-open No. 2013-198347 or the like generally locks the member to be supported from one direction relative to the supporting body and has room for further improvement in the mounting workability of the member to be supported relative to the supporting body.

SUMMARY OF THE INVENTION

The present invention has been achieved in view of the above, and an object thereof is to provide a locking structure between a member to be supported and a supporting body with improved mounting workability of the member to be supported relative to the supporting body.

According to one aspect of the present invention, a locking structure between a member to be supported and a supporting body, the locking structure includes a member to be supported; a supporting body configured to include a first opening and a second opening provided on respective both sides in a predetermined fitting direction and to be able to fit the member to be supported along the fitting direction from the first opening and the second opening; a first lock mechanism configured to lock the member to be supported to the supporting body to prevent the member to be supported from escaping toward the first opening, when the member to be supported is fitted to the supporting body from the first opening; and a second lock mechanism configured to lock the member to be supported to the supporting body to prevent the member to be supported from escaping toward the second opening, when the member to be supported is fitted to the supporting body from the second opening, wherein the first lock mechanism is configured to function as a guide part that guides the member to be supported to the fitting direction, when the member to be supported is fitted to the supporting body from the second opening, and the second lock mechanism is configured to function as a guide part that guides the member to be supported to the fitting direction, when the member to be supported is fitted to the supporting body from the first opening.

According to another aspect of the present invention, the member to be supported has a plurality of outer peripheral faces, the supporting body has a plurality of inner peripheral faces arranged facing the outer peripheral faces when the member to be supported is fitted, the first lock mechanism is provided in between one outer peripheral face of the outer peripheral faces of the member to be supported and an inner peripheral face facing the outer peripheral face, and the second lock mechanism is provided in between an outer peripheral face and an inner peripheral face different from the outer peripheral face and the inner peripheral face for the first lock mechanism.

According to still another aspect of the present invention, the first lock mechanism and the second lock mechanism are oppositely arranged when the member to be supported is fitted to the supporting body.

According to still another aspect of the present invention, another second lock mechanism different from the second lock mechanism is provided in between the outer peripheral face and the inner peripheral face in between which the first lock mechanism is provided, and another first lock mechanism different from the first lock mechanism is provided in between the outer peripheral face and the inner peripheral face in between which the second lock mechanism is provided.

According to still another aspect of the present invention, the member to be supported has a plurality of outer peripheral faces, the supporting body has a plurality of inner peripheral faces arranged facing the outer peripheral faces when the member to be supported is fitted, and the first lock mechanism and the second lock mechanism are provided in between one outer peripheral face of the outer peripheral faces of the member to be supported and an inner peripheral face facing the one outer peripheral face.

According to still another aspect of the present invention, the first lock mechanism includes a first engagement claw provided on one of the member to be supported and the supporting body, and a first lock arm that is provided on the other of the member to be supported and the supporting body, and locks the first engagement claw to prevent the first engagement claw from escaping toward the first opening, when the member to be supported is fitted to the supporting body, the second lock mechanism includes a second engagement claw provided on one of the member to be supported and the supporting body, and a second lock arm that is provided on the other of the member to be supported and the supporting body, and locks the second engagement claw to prevent the second engagement claw from escaping toward the second opening, when the member to be supported is fitted to the supporting body, the first lock arm is configured to function as a guide part that guides the first engagement claw to the fitting direction, when the member to be supported is fitted to the supporting body from the second opening, and the second lock arm is configured to function as a guide part that guides the second engagement claw to the fitting direction, when the member to be supported is fitted to the supporting body from the first opening.

According to still another aspect of the present invention, the first lock arm includes a first shaft, and a pair of first arms that are connected to both ends of the first shaft and extend from the first shaft toward the second opening, and the second lock arm includes a second shaft, and a pair of second arms that are connected to both ends of the second shaft and extend from the second shaft toward the first opening.

The above and other objects, features, advantages and technical and industrial significance of this invention will be

DETAILED DESCRIPTION OF THE PREFERRED EMBODIMENTS

Figure 1:
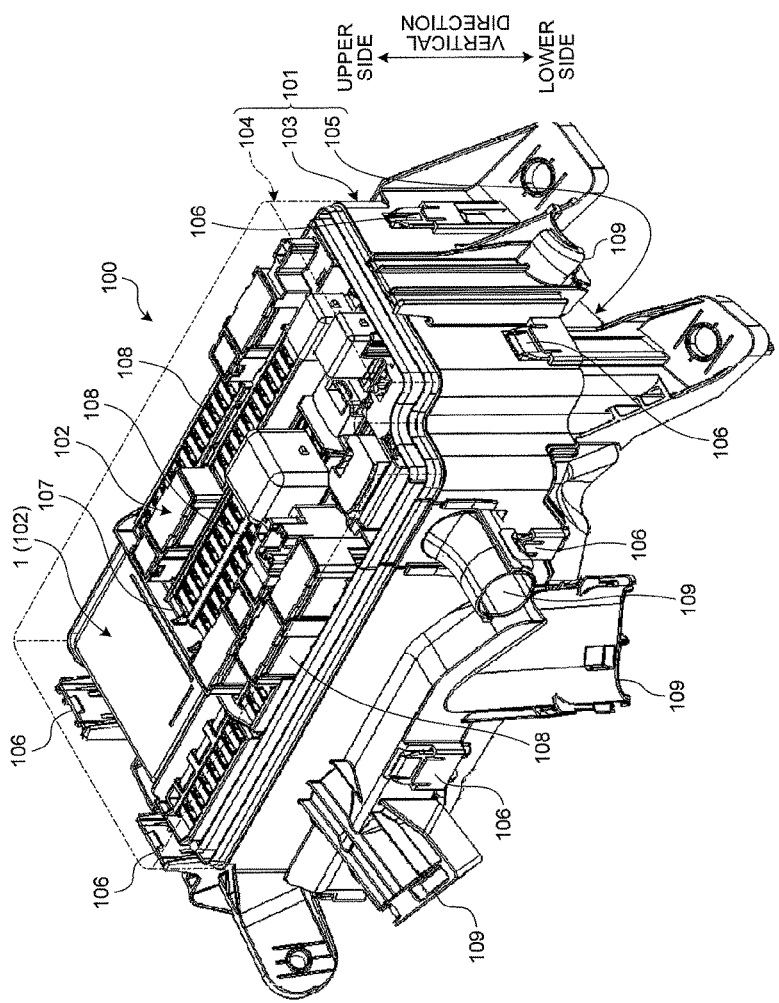
FIG. 1 is a perspective view illustrating a schematic configuration of an electrical connection box.

The following describes embodiments of a locking structure between a member to be supported and a supporting body according to the present invention with reference to the drawings. In the drawings below, the same reference numerals will be attached to the same or corresponding components, and descriptions thereof will not be repeated.

Embodiment

Figure 2:
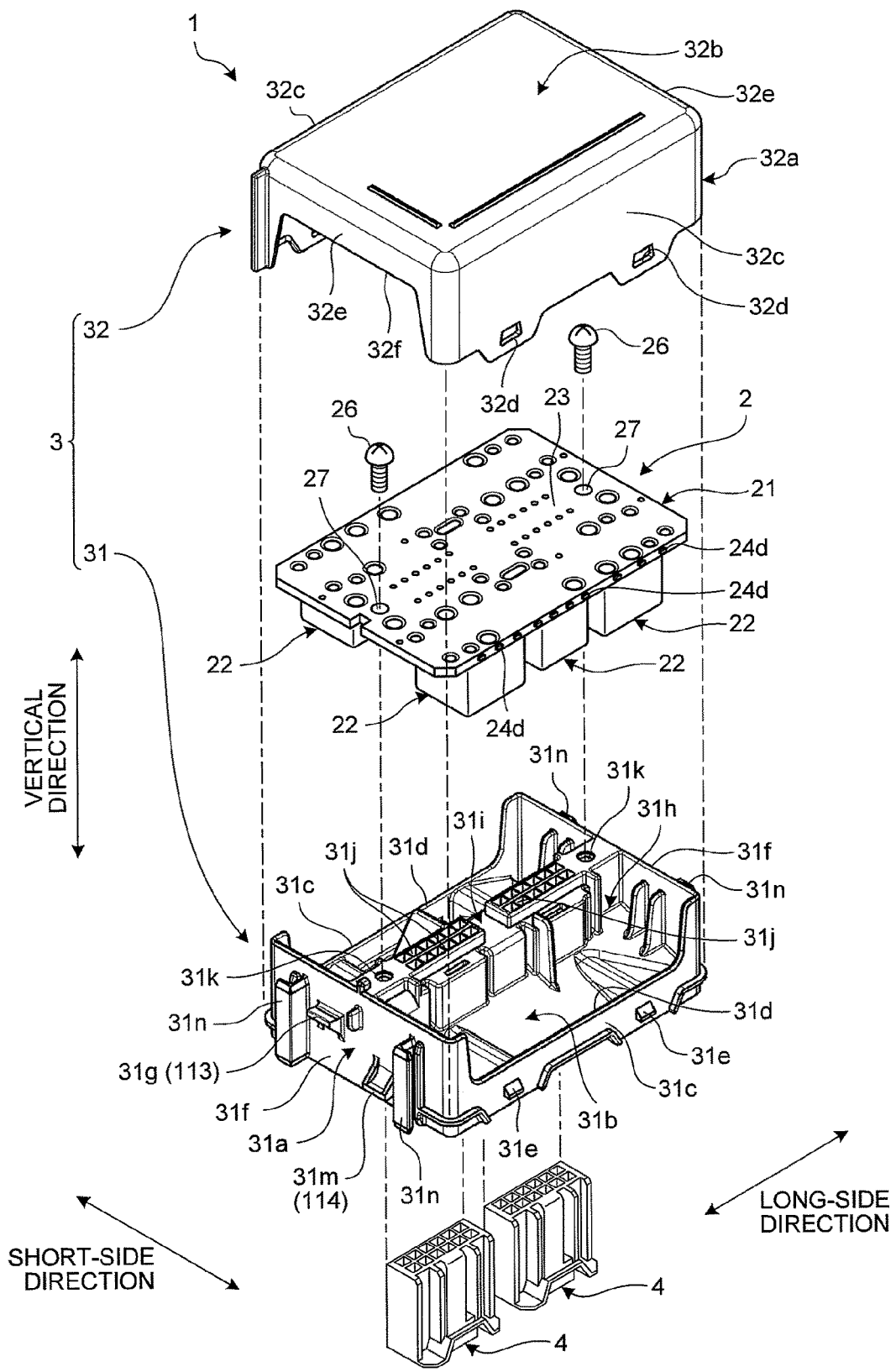
FIG. 2 is an exploded perspective view illustrating a schematic configuration of an electronic component unit in FIG. 1.
Figure 3:
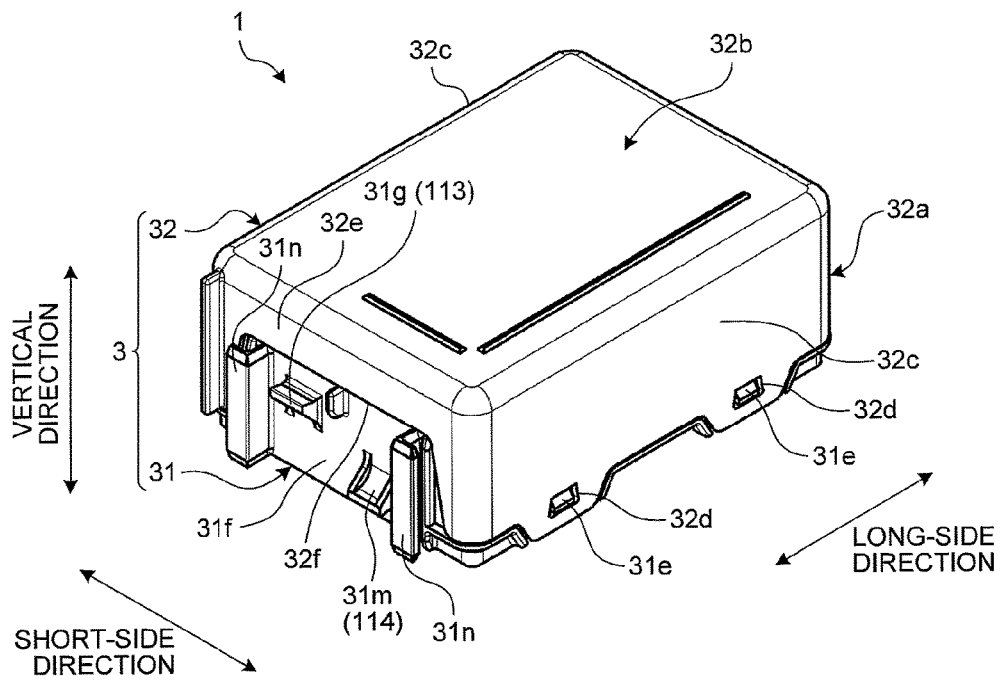
FIG. 3 is a perspective view illustrating a schematic configuration of the electronic component unit.
Figure 4:
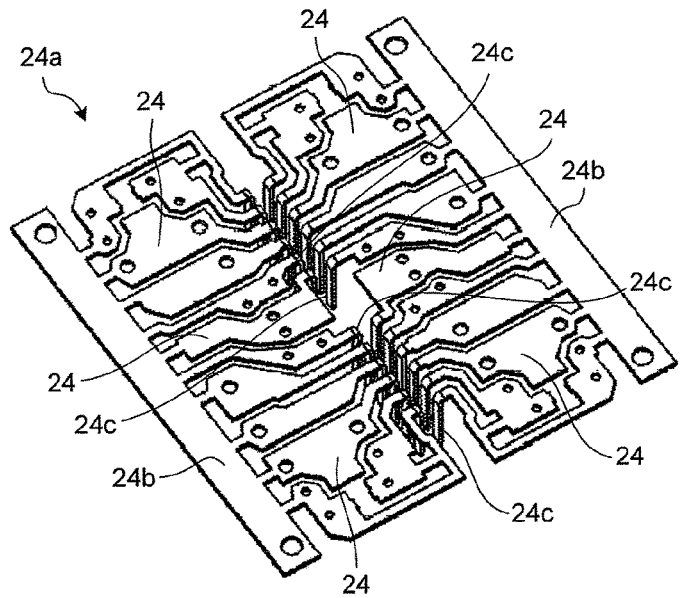
FIG. 4 is a perspective view explaining bus bars of the electronic component unit.
Figure 5:
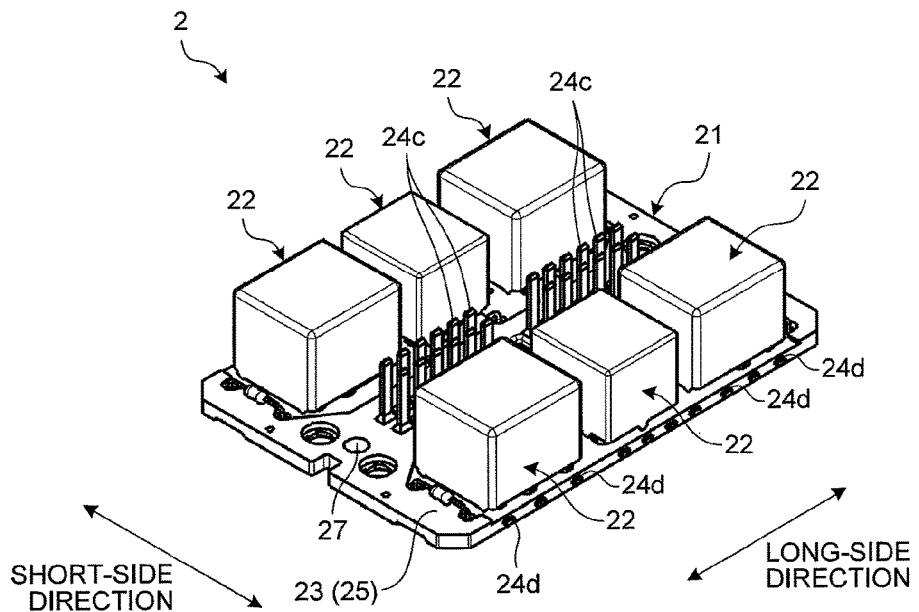
FIG. 5 is a perspective view illustrating a schematic configuration of an insert bus bar plate of the electronic component unit.
Figure 6:
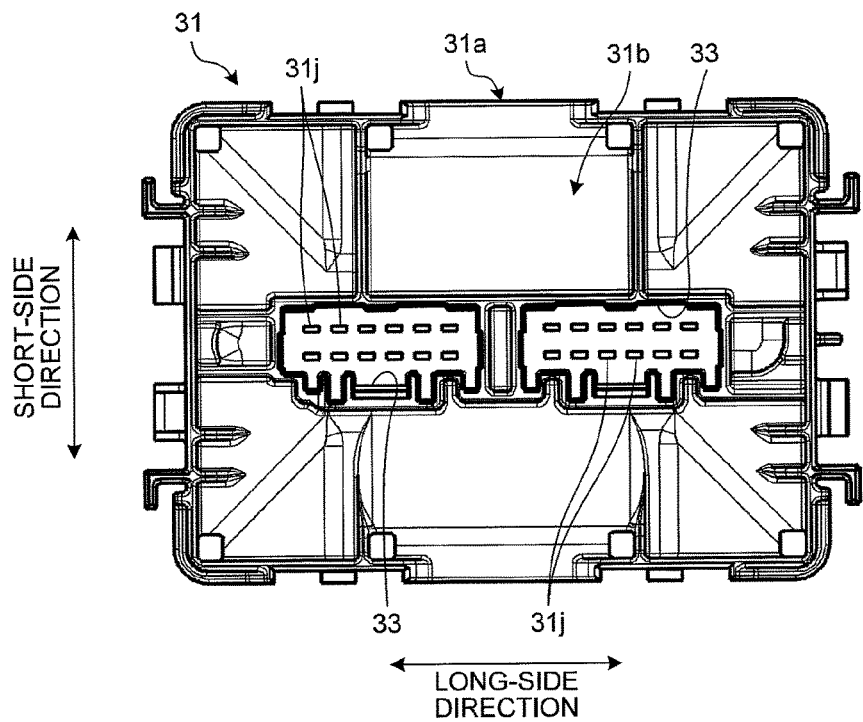
FIG. 6 is a plan view of a connector fitting part side of a base cover of the electronic component unit.
Figure 7:
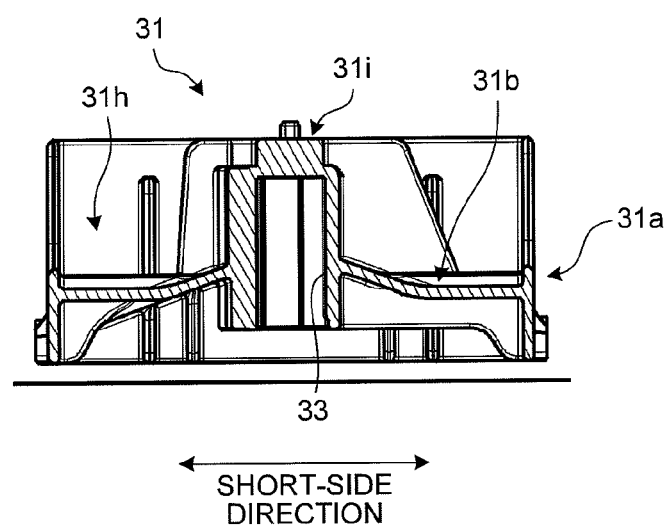
FIG. 7 is a sectional view including a connector fitting part of the base cover of the electronic component unit.

FIG. 1 is a perspective view illustrating a schematic configuration of an electrical connection box for which an electronic component unit according to the embodiment is used. FIG. 2 is an exploded perspective view illustrating a schematic configuration of the electronic component unit according to the embodiment. FIG. 3 is a perspective view illustrating a schematic configuration of the electronic component unit according to the embodiment. FIG. 4 is a perspective view explaining bus bars of the electronic component unit according to the embodiment. FIG. 5 is a perspective view illustrating a schematic configuration of an insert bus bar plate of the electronic component unit according to the embodiment. FIG. 6 is a plan view of a connector fitting part side of a base cover of the electronic component unit according to the embodiment. FIG. 7 is a sectional view including a connector fitting part of the base cover of the electronic component unit according to the embodiment. FIG. 1 illustrates an upper cover of the electrical connection box with a chain double-dashed line.

As illustrated in FIG. 1, an electronic component unit 1 according to the present embodiment constitutes an electronic component module detachably assembled to an electrical connection box 100 installed in vehicles such as automobiles. The electrical connection box 100 collectively houses therein connectors that constitute connection processing components for wire harnesses, electric wires, or the like, fuses, relays, branch parts, electric equipment such as electronic control units. The electrical connection box 100 is, for example, installed in an engine room of a vehicle or a lower part of a vehicle body and is connected to between a power supply such as a battery and various electronic devices installed in the vehicle. The electrical connection box 100 distributes electric power supplied from the power supply to the various electronic devices in the vehicle. The electrical connection box 100 may be called a junction box, a fuse box, a relay box, or the like, which are collectively called the electrical connection box in the present embodiment.

The electrical connection box 100 exemplified in FIG. 1 houses various electronic components 102 in a housing space within a box main body 101. The box main body 101 includes, for example, a body 103, an upper cover 104, and a lower cover 105. The box main body 101 has a three-layer divided structure divided into the body 103, the upper cover 104, and the lower cover 105. The body 103, the upper cover 104, and the lower cover 105 are formed of insulating synthetic resin. The body 103 is a main member forming the housing space to which the electronic components 102 are assembled. The body 103 is formed into a nearly hollow rectangular cylindrical shape, and openings are positioned on the vertical upper side and the vertical lower side with the electrical connection box 100 connected to the engine room or the like. The upper cover 104 is a lid-shaped member that blocks the opening on the vertical upper side of the body 103. The lower cover 105 is a lid-shaped (tray-shaped) member that blocks the opening on the vertical lower side of the body 103. In the box main body 101, the upper cover 104 is assembled to the vertical upper side of the body 103, whereas the lower cover 105 is assembled to the vertical lower side of the body 103 so that the opening on the vertical upper side of the body 103 and an opening of the upper cover 104 face each other and that the opening on the vertical lower side of the body 103 and an opening of the lower cover 105 face each other. In the box main body 101, the upper cover 104 and the lower cover 105 are locked to the body 103 through a lock mechanism 106 of various types. Although a direction in which the body 103, the upper cover 104, and the lower cover 105 are stacked is generally along the vertical direction with the electrical connection box 100 connected to the engine room or the like, the stacking direction may have a certain angle relative to the vertical direction depending on installation conditions of the electrical connection box 100.

The various electronic components 102 assembled to the housing space within the box main body 101 include, as described above, the electronic component unit 1 according to the present embodiment together with the connectors, fuses, relays, branch parts, electronic control units, or the like. In the electrical connection box 100, the various electronic components 102 are assembled to the inside of many cavities formed by partition walls 107 of various shapes integrally formed with the body 103 and blocks 108 of various shapes detachably assembled to the body 103, and the like. In this case, the partition walls 107, the blocks 108, and the like are also formed of insulating synthetic resin similarly to the body 103 and the like. In the electrical connection box 100, terminals or the like of electric wires routed through openings 109 or the like are fitted to the cavities to which the various electronic components 102 are assembled from the vertical lower side and are electrically connected thereto.

As illustrated in FIG. 2 through FIG. 7, the electronic component unit 1 according to the present embodiment includes an insert bus bar plate 2 as a plate, a housing 3, and connectors 4 as connection parts with electric wires, in which the insert bus bar plate 2 is assembled to the inside of the housing 3.

As illustrated in FIG. 2, FIG. 4, and FIG. 5, the insert bus bar plate 2 is a substrate in which metallic bus bars 24 are incorporated in a resin member 23 on which electronic components 22 are mounted. The insert bus bar plate 2 includes a substrate main body 21 and the electronic components 22.

The substrate main body 21 incorporates the plural conductive bus bars 24 in the resin member 23, in which, in other words, the plural bus bars 24 are covered with the insulating resin member 23 to be isolated from each other. The substrate main body 21 is formed by, for example, insert molding, which injects resin into around the bus bars 24 that are formed of conductive metal and placed in a mold to integrate the metal and the resin.

A bus bar assembly before molding 24a exemplified in FIG. 4 illustrates an assembly of the bus bars 24 before insert molding in which the plural bus bars 24 are coupled through carriers 24b. The bus bar assembly before molding 24a is formed of conductive metal and is formed into, for example, a nearly plate shape as a whole by press working, for example. The bus bar assembly before molding 24a is inserted into a mold for insert molding with terminals 24c of the respective bus burs 24 bent. The substrate main body 21 is formed by injecting insulating resin into around the bus bar assembly before molding 24a inserted into the mold to integrally mold the bus bars 24 and the resin member 23. In the substrate main body 21, the carriers 24b are cut after the bus bars 24 and the resin member 23 are integrally molded. The substrate main body 21 is formed into a rectangular plate shape as a whole.

As illustrated in FIG. 5 or the like, in the insert molded substrate main body 21, the terminals 24c of the respective bus bars 24 are arranged at nearly the central part in a short-side direction (a first width direction) along a long-side direction (a second width direction perpendicular to the first width direction). The terminals 24c are arranged in two rows along the long-side direction. The terminals 24c are erected nearly perpendicularly to a mounting face 25 on which the electronic components 22 are mounted in the substrate main body 21. In other words, the terminals 24c protrude and extend from the mounting face 25 along a direction perpendicular to the short-side direction and the long-side direction. The terminals 24c are positioned between the electronic components 22 described below relative to the short-side direction. In other words, the terminals 24c are collected at the central part of the mounting face 25. In the substrate main body 21, ends on the side formerly coupled to the carriers 24b cut after insert molding are formed as exposed ends 24d exposed out of the resin member 23 on end faces of the substrate main body 21 in the respective bus bars 24. In other words, the insert bus bar plate 2 exposes the exposed ends 24d of the bus bars 24 on the end faces. The exposed ends 24d are formed on a pair of long-side end faces facing in the substrate main body 21. The plural exposed ends 24d are arranged and exposed on the respective long-side end faces in the long-side direction.

The electronic components 22 are mounted on the mounting face 25 of the substrate main body 21 and are elements that exhibit various functions in this embodiment. In the electronic components 22, respective terminals are electrically connected to predetermined bus bars 24 and are fixed to the back of the mounting face 25 by soldering or the like. The electronic components 22 of the present embodiment are, for example, relays. In other words, the electronic component unit 1 of the present embodiment is a relay unit module. The insert bus bar plate 2 of the present embodiment includes three relays as the electronic components 22 arranged on each side of the terminals 24c in the short-side direction along the long-side direction, that is, a total of six relays. In other words, in the insert bus bar plate 2, the electronic components 22 are arranged in two rows, and the terminals 24c are arranged in two rows in between the two rows of the electronic components 22. The insert bus bar plate 2 of the present embodiment basically has a shape that is nearly line symmetric relative to a center line along the long-side direction of the substrate main body 21 (that is, a center line in the short-side direction). The terminals 24c and the electronic components 22 are also arranged in nearly line symmetry. Elements such as relay resistors are also mounted on the insert bus bar plate 2 as the electronic components 22 in addition to the six relays.

As illustrated in FIG. 2, FIG. 3, FIG. 6, and FIG. 7, the housing 3 includes a base cover 31 as a base, a top cover 32 as a lid, and connector fitting parts 33 as connection part fitting parts. To the base cover 31, the insert bus bar plate 2 is assembled. The top cover 32 covers the insert bus bar plate 2 assembled to the base cover 31 from the side opposite to the base cover 31. The connector fitting parts 33, to which the connectors 4 as connection parts between the terminals 24c of the bus bars 24 and the electric wires are fitted, are formed integrally with the base cover 31. The base cover 31, the top cover 32, and the connector fitting parts 33 are formed of insulating synthetic resin.

Specifically, as illustrated in FIG. 2, the base cover 31 is a dish-shaped (tray-shaped) member. The base cover 31 includes a rectangular frame-shaped part 31a formed into a nearly hollow rectangular shape and a base 31b that blocks the rectangular frame-shaped part 31a. The base 31b is formed into a rectangular plate shape similar to the substrate main body 21 of the insert bus bar plate 2. The rectangular frame-shaped part 31a is formed so as to surround the edge of the base 31b. The base 31b is formed integrally with the rectangular frame-shaped part 31a at a halfway height position of the rectangular frame-shaped part 31a (refer to FIG. 7 or the like). In the rectangular frame-shaped part 31a, a pair of long-side wall faces 31c along the long-side direction of the base 31b are formed with notches 31d and engagement claws 31e to be engaged with the top cover 32. In the rectangular frame-shaped part 31a, a pair of short-side wall faces 31f along the short-side direction of the base 31b are formed with engagement claws 31g, 31m to be engaged with the box main body 101 (the body 103) of the electrical connection box 100 and guide members 31n for guiding the electronic component unit 1 to a predetermined fitting position of the body 103 of the electrical connection box 100. The base cover 31 is formed into a rectangular tubular shape (partially notched by the notches 31d) in which the halfway height position of the rectangular frame-shaped part 31a is blocked with the base 31b. In the base cover 31, a space surrounded by the rectangular frame-shaped part 31a and the base 31b is defined as a housing space 31h that houses therein the electronic components 22 of the insert bus bar plate 2.

The base cover 31 is formed with a central wall-shaped part 31i at the central part of the base 31b. The central wall-shaped part 31i is formed so that the base 31b protrudes toward the housing space 31h. The central wall-shaped part 31i is formed at nearly the central part of the base 31b in the short-side direction along the long-side direction. The central wall-shaped part 31i extends from one short-side wall face 31f to the other short-side wall face 31f along the long-side direction. The central wall-shaped part 31i is formed with a plurality of terminal fitting holes 31j and a pair of screw holes 31k on a top end face thereof. The terminal fitting holes 31j are holes to which the terminals 24c of the respective bus bars 24 are fitted when the insert bus bar plate 2 is assembled to the base cover 31 and are formed in number and position corresponding to the terminals 24c. The terminal fitting holes 31j are arranged in two rows along the long-side direction in this example. The screw holes 31k are holes to which, when the insert bus bar plate 2 is assembled to the base cover 31, screws 26 for tightening the insert bus bar plate 2 to the base cover 31 are screwed.

As illustrated in FIG. 6 and FIG. 7, in the base cover 31, the back side of the central wall-shaped part 31i, that is, the side opposite to the housing space 31h is hollowed, and the hollow part is formed as the connector fitting parts 33 to which the connectors 4 as the connection parts with the electric wires are fitted. The terminals 24c of the respective bus bars 24 are exposed within the connector fitting parts 33 through the respective terminal fitting holes 31j, with the insert bus bar plate 2 assembled to the base cover 31. The connector fitting parts 33 are formed at two positions in this example, and a total of two connectors 4 are fitted to the two connector fitting parts 33 on a one-by-one basis. In other words, in the electronic component unit 1 of the present embodiment, the two connectors 4 are connected to the terminals 24c of the bus bars 24.

As illustrated in FIG. 2, the top cover 32 is a lid-shaped member. The top cover 32 includes a rectangular frame-shaped part 32a formed into a nearly hollow rectangular shape and a ceiling 32b that blocks one opening of the rectangular frame-shaped part 32a. The ceiling 32b is formed into a rectangular plate shape similar to the substrate main body 21 of the insert bus bar plate 2 and the base 31b of the base cover 31. The rectangular frame-shaped part 32a is formed so as to be erected on the edge of the ceiling 32b. The rectangular frame-shaped part 32a is formed with engagement recesses 32d to be engaged with the base cover 31 in a pair of long-side wall faces 32c along the long-side direction of the ceiling 32b. In the rectangular frame-shaped part 32a, a pair of short-side wall faces 32e along the short-side direction of the ceiling 32b are formed with notches 32f. The top cover 32 is formed into a rectangular tubular shape (partially notched by the notches 32f) that opens on one end and is blocked on the other end by the rectangular frame-shaped part 32a and the ceiling 32b.

As illustrated in FIG. 2 and FIG. 3, in the electronic component unit 1 configured as described above, with the insert bus bar plate 2 assembled to the base cover 31 and with the side of the insert bus bar plate 2 opposite to the base cover 31 covered with the top cover 32, the connectors 4 are fitted to the connector fitting parts 33, thereby forming one module.

More specifically, in the electronic component unit 1, the insert bus bar plate 2 is assembled to the base cover 31 in a positional relation in which the electronic components 22 of the insert bus bar plate 2 are housed in the housing space 31h of the base cover 31, that is, in a positional relation in which the mounting face 25 (refer to FIG. 5 or the like) on which the electronic components 22 are mounted faces the base 31b of the base cover 31. In the electronic component unit 1, with the insert bus bar plate 2 assembled to the base cover 31, the terminals 24c of the bus bars 24 of the insert bus bar plate 2 are fitted to the respective terminal fitting holes 31j of the base cover 31, and the terminals 24c are exposed within the connector fitting parts 33 along a direction perpendicular to the short-side direction and the long-side direction. In the electronic component unit 1, the screws 26 are inserted into screw holes 27 of the insert bus bar plate 2 and are screwed to the screw holes 31k of the base cover 31, thereby tightening the insert bus bar plate 2 and the base cover 31 with each other. In the electronic component unit 1, with the insert bus bar plate 2 assembled to the base cover 31, three electronic components 22 are positioned on each side of the central wall-shaped part 31i in the short-side direction.

In the electronic component unit 1, the top cover 32 is fitted to the base cover 31 and the like in a positional relation in which the insert bus bar plate 2 assembled to the base cover 31 is covered with the top cover 32 from the side opposite to the base cover 31. In the electronic component unit 1, with the top cover 32 fitted to an appropriate position, the respective engagement recesses 32d of the top cover 32 are engaged with the respective engagement claws 31e of the base cover 31, thereby assembling the top cover 32 to the base cover 31. As illustrated in FIG. 3 or the like, in the electronic component unit 1, with the top cover 32 assembled to the base cover 31, the rectangular frame-shaped part 32a of the top cover 32 is positioned so as to overlap the outside of the rectangular frame-shaped part 31a of the base cover 31, and the engagement claws 31g, 31m are exposed out of the notches 32f of the top cover 32. In the electronic component unit 1, the connectors 4 are fitted to the connector fitting parts 33 along the direction perpendicular to the short-side direction and the long-side direction, thereby connecting the connectors 4 to the terminals 24c of the bus bars 24 and causing the electronic component unit 1 to be assembled to a predetermined place within the box main body 101 (the body 103) of the electrical connection box 100 via the engagement claws 31g.

Although a stacking direction in which the base cover 31, the insert bus bar plate 2, and the top cover 32 are stacked is along the vertical direction with the electrical connection box 100 connected to the engine room or the like similarly to the electrical connection box 100, the stacking direction may have a certain angle relative to the vertical direction depending on installation conditions of the electrical connection box 100.

Figure 8:
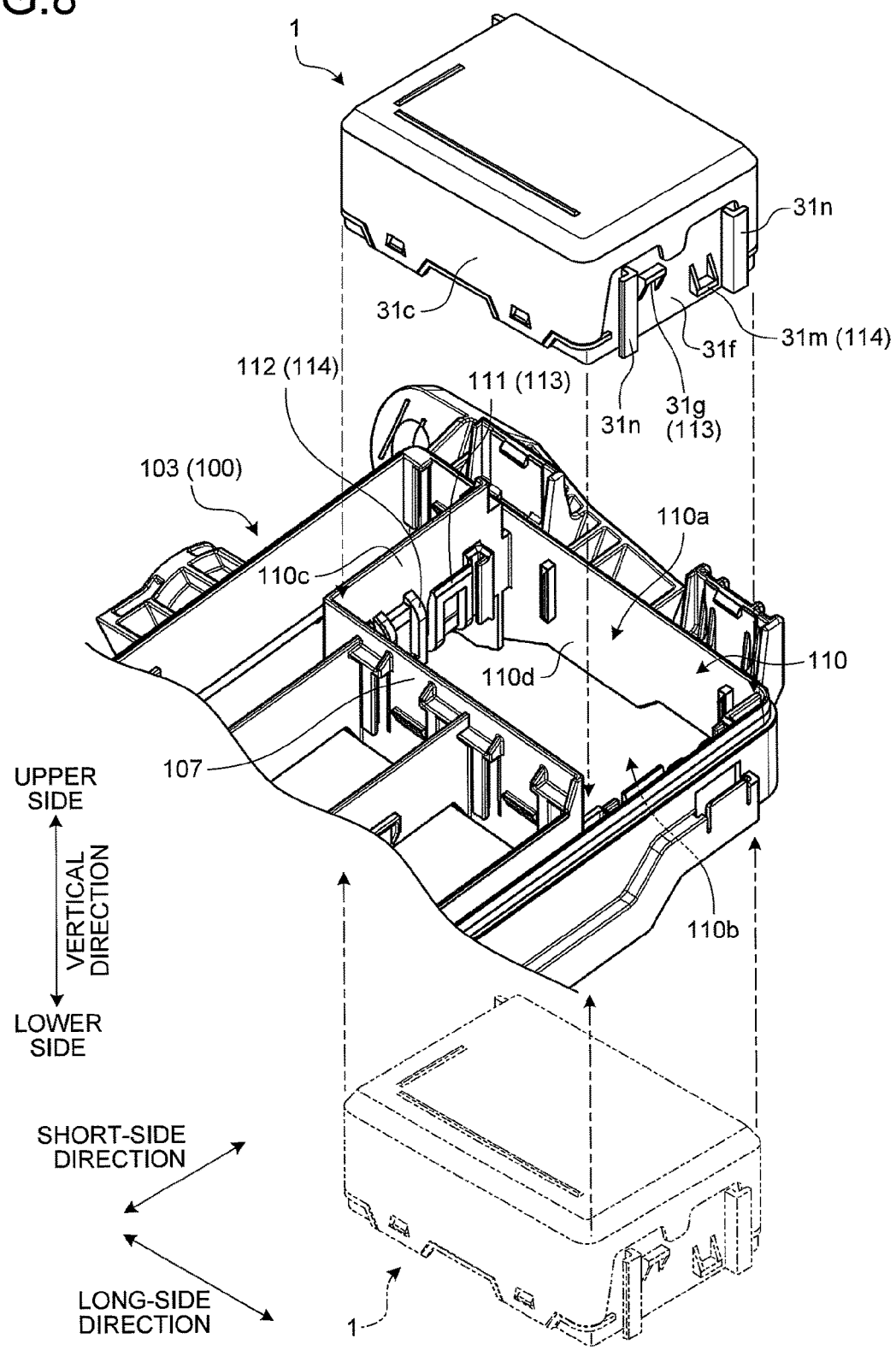
FIG. 8 is a perspective view illustrating a schematic configuration of a locking structure between the electronic component unit and a body of the electrical connection box according to an embodiment of the present invention.
Figure 9:
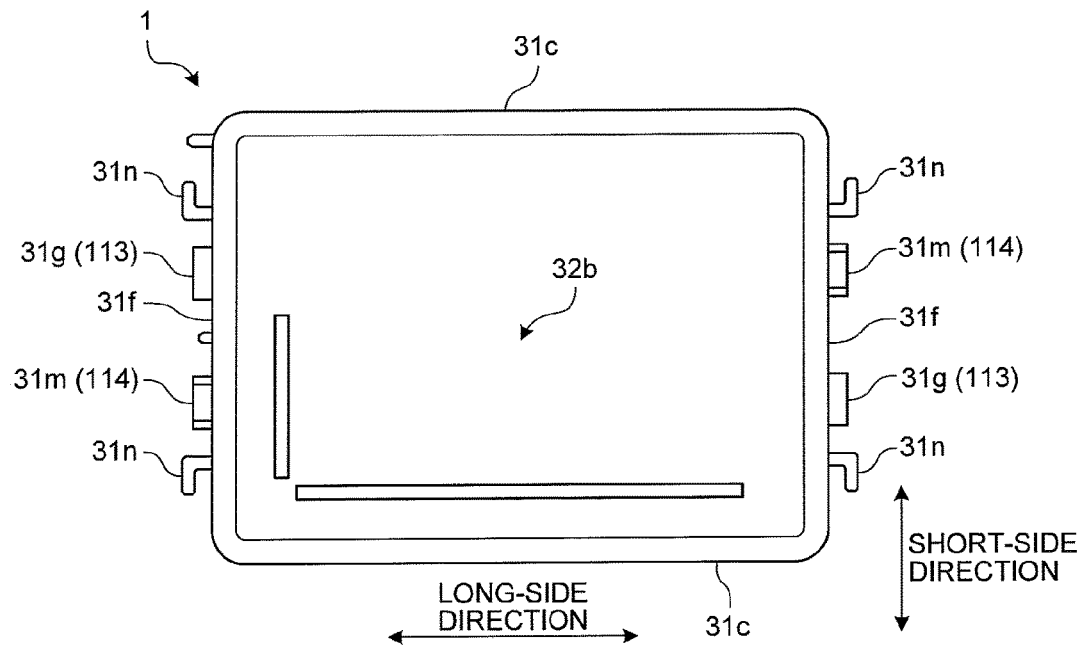
FIG. 9 is a top view of the electronic component unit.
Figure 10:
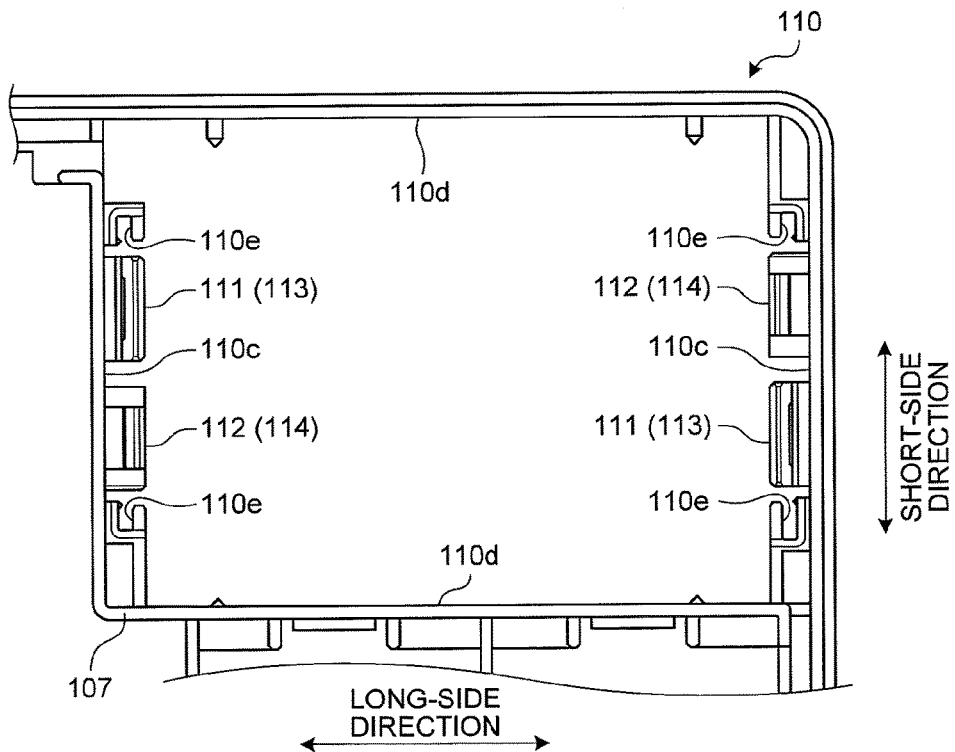
FIG. 10 is a top view enlarging an electronic component unit housing part of the body.
Figure 11:
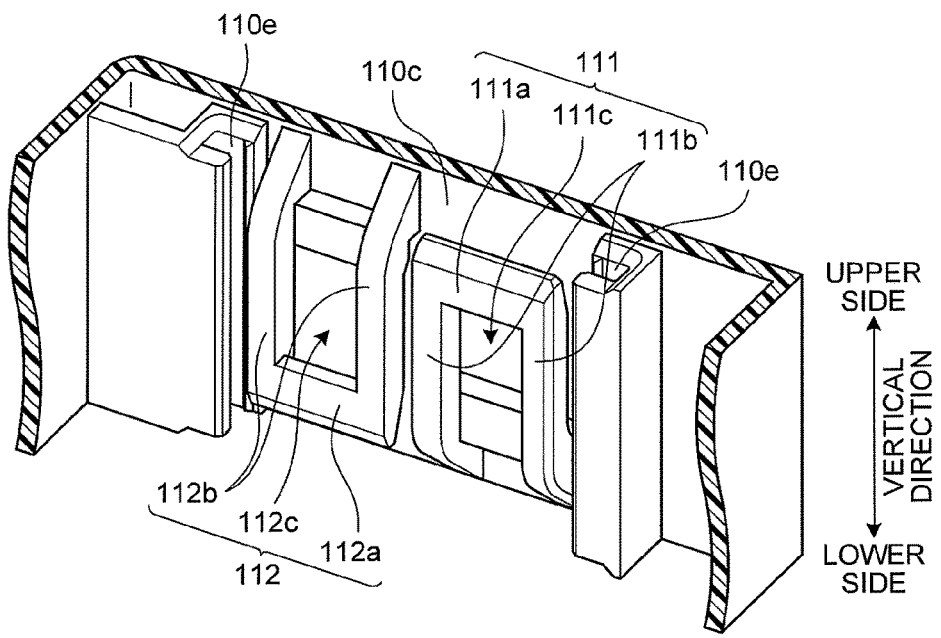
FIG. 11 is a partially cut-out perspective view enlarging lock arms of the electronic component unit housing part.
Figure 12:
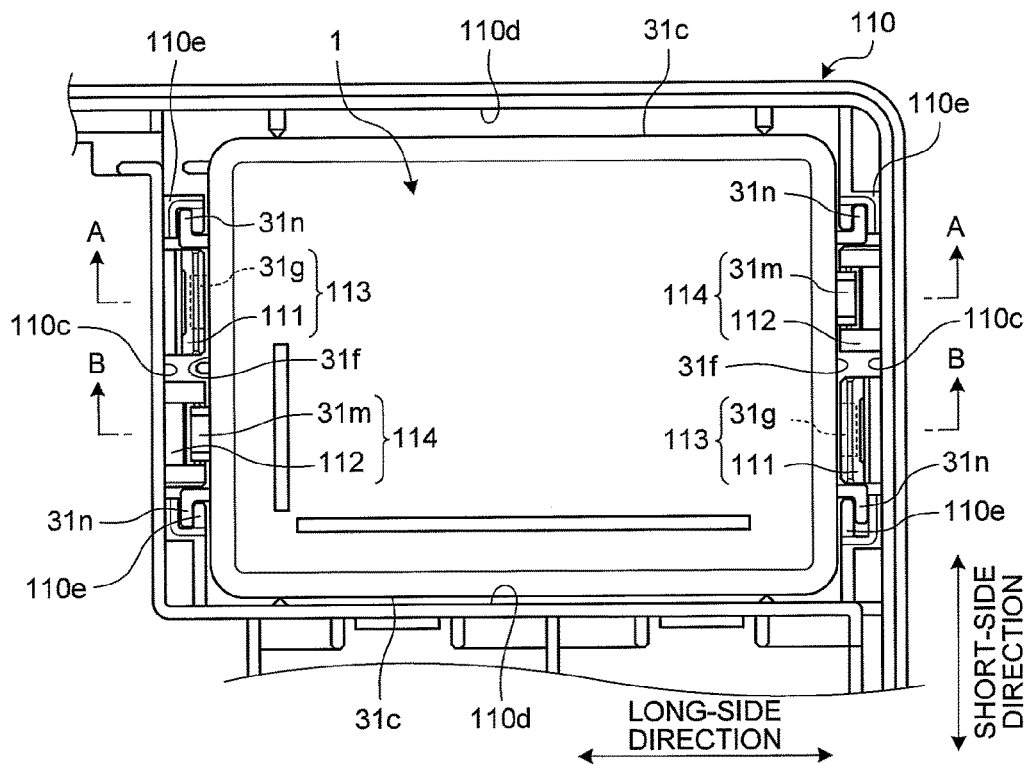
FIG. 12 is a top view illustrating a fitting state between the electronic component unit and the electronic component unit housing part of the body of the electrical connection box.
Figure 13:
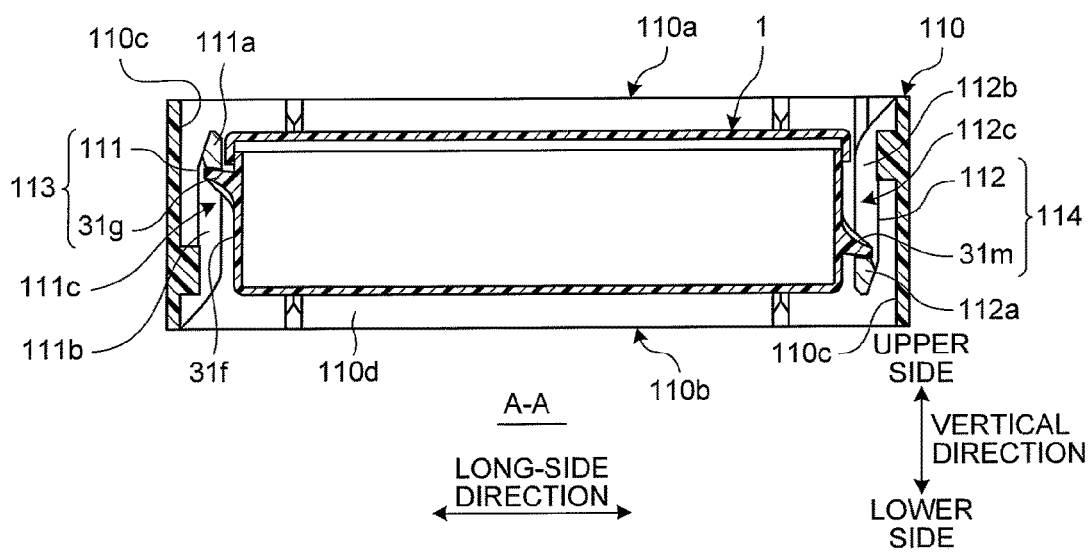
FIG. 13 is an A-A sectional view of FIG. 12.
Figure 14:
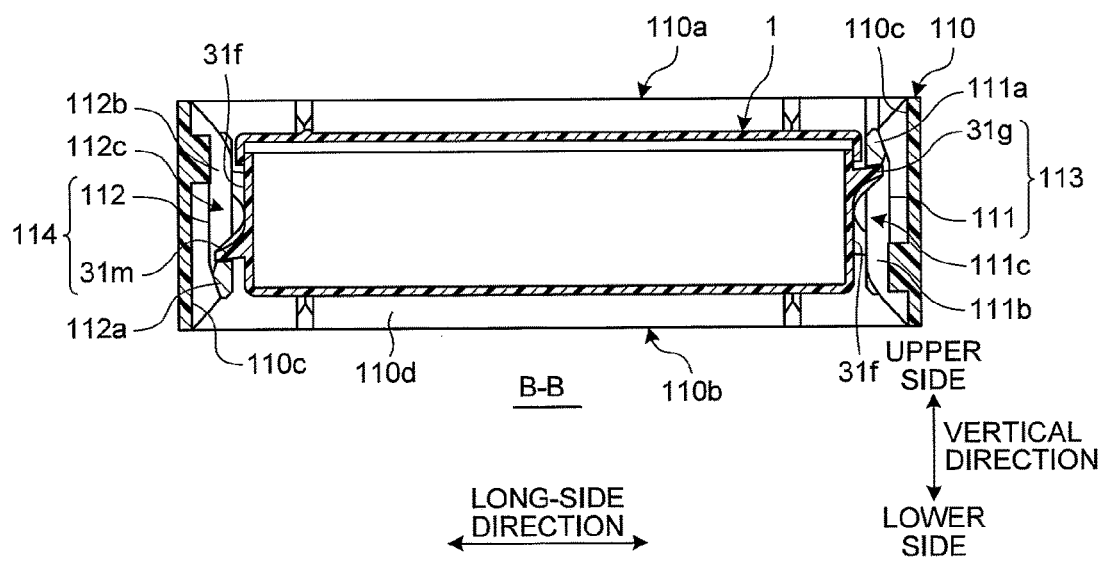
FIG. 14 is a B-B sectional view of FIG. 12.

Described next with reference to FIGS. 8 through 14 is a locking structure between the electronic component unit 1 (the member to be supported) and the body 103 (the supporting body) of the electrical connection box 100 according to the present embodiment. FIG. 8 is a perspective view illustrating a schematic configuration of a locking structure between the electronic component unit and a body of the electrical connection box according to an embodiment of the present invention. FIG. 9 is a top view of the electronic component unit. FIG. 10 is a top view enlarging an electronic component unit housing part of the body. FIG. 11 is a partially cut-out perspective view enlarging lock arms of the electronic component unit housing part. FIG. 12 is a top view of a fitting state between the electronic component unit and the electronic component unit housing part of the body of the electrical connection box. FIG. 13 is an A-A sectional view of FIG. 12. FIG. 14 is a B-B sectional view of FIG. 12.

As described above, the electronic component unit 1 is mounted on the body 103 of the electrical connection box 100, and more specifically, is housed in an electronic component unit housing part 110 formed as part of the body 103 as illustrated in FIG. 8. The electronic component unit housing part 110 is formed in the housing space of the body 103 by the partition walls 107 and is formed into a rectangular shape that is nearly the same shape as electronic component unit 1 in a plan view (in a vertical view) so as to be capable of fitting the electronic component unit 1 on the inner peripheral side. The electronic component unit housing part 110 includes a pair of short-side inner peripheral faces 110c facing the short-side wall faces 31f and a pair of long-side inner peripheral faces 110d facing the long-side wall faces 31c as a plurality of inner peripheral faces arranged on the outer peripheral side of the outer peripheral faces (the short-side wall faces 31f and the long-side wall faces 31c) of the electronic component unit 1 when the electronic component unit 1 is fitted.

As illustrated in FIGS. 13 and 14 or the like, the electronic component unit housing part 110 opens on both vertical upper and lower sides in the vertical direction. Hereinafter, an opening of the electronic component unit housing part 110 on the vertical upper side will be called an upper-side opening 110a (a first opening), whereas an opening on the vertical lower side will be called a lower-side opening 110b (a second opening). As illustrated in FIG. 8, the electronic component unit 1 can be fitted to the electronic component unit housing part 110 from the vertical upper side through the upper-side opening 110a and can be fitted to the electronic component unit housing part 110 from the vertical lower side through the lower-side opening 110b. In other words, the electronic component unit 1 is mountable and dismountable on and from the body 103 of the electrical connection box 100 from both the vertical upper side and lower side. The electronic component unit 1, when it is assembled to the electrical connection box 100, is mounted thereon mainly from the vertical lower side through the lower-side opening 110b. In the maintenance of the electrical connection box 100, the electronic component unit 1 is dismounted from the upper-side opening 110a to the vertical upper side. After completion of the maintenance, the electronic component unit 1 is mounted on the electrical connection box 100 mainly from the vertical upper side through the upper-side opening 110a in contrast to the time of assembling.

As described above, as illustrated in FIGS. 8 and 9, for example, the engagement claws 31g (first engagement claws) and the engagement claws 31m (second engagement claws) are provided on the respective faces of the pair of short-side wall faces 31f of the electronic component unit 1. As illustrated in FIGS. 13 and 14, for example, the engagement claws 31g, 31m are formed so as to protrude from the faces of the short-side wall faces 31f toward the outside (the normal direction of the short-side wall faces 31f, for example). As illustrated in FIG. 8 or the like, the engagement claws 31g, 31m are arranged along the short-side direction, in which when the short-side wall face 31f is viewed from the outside, one engagement claw 31g is arranged on the left side in the short-side direction, whereas the other engagement claw 31m is arranged on the right side in the short-side direction. The engagement claws 31g, 31m are provided so as to have different positions in the vertical direction, in which the position of the one engagement claw 31g in the vertical direction is arranged upper than the other engagement claw 31m.

As illustrated in FIGS. 8, 10, and 11, for example, two lock arms, that is, a lock arm 111 (a first lock arm) and a lock arm 112 (a second lock arm) are provided on the short-side inner peripheral face 110c of the electronic component unit housing part 110 at positions facing the engagement claws 31g, 31m, respectively. The lock arms 111, 112 are arranged along the short-side direction, in which, when the short-side inner peripheral face 110c is viewed from the inside, one lock arm 111 is arranged on the right side in the short-side direction, whereas the other lock arm 112 is arranged on the left side in the short-side direction. The two lock arms 111, 112 are formed by the same components, with the components of the two reversed in the vertical direction.

As illustrated in FIG. 11, the lock arm 111 includes a shaft 111a (a first shaft) extending in the short-side direction and a pair of arms 111b (a first arm) that connect both ends of the shaft 111a and the short-side inner peripheral face 110c. The lock arm 111 is formed so that the shaft 111a is positioned on the vertical upper side than the arms 111b. In other words, in the pair of arms 111b, their basal ends are connected to the short-side inner peripheral face 110c and extend toward the vertical upper side, whereas their tips are connected to the shaft 111a. The lock arm 112 includes a shaft 112a (a second shaft) extending in the short-side direction and a pair of arms 112b (a second arm) that connect both ends of the shaft 112a and the short-side inner peripheral face 110c. The lock arm 112 is formed so that the shaft 112a is positioned on the vertical lower side than the arms 112b in contrast to the lock arm 111. In other words, in the pair of arms 112b, their basal ends are connected to the short-side inner peripheral face 110c and extend toward the vertical lower side, whereas their tips are connected to the shaft 112a.

The two engagement claws 31g, 31m provided on the same short-side wall face 31f are arranged in point symmetry relative to an intermediate position between the two in the short-side direction. Similarly, the two lock arms 111, 112 provided on the same short-side inner peripheral face 110c are also arranged in point symmetry relative to an intermediate position between the two in the short-side direction.

The pair of arms 111b of the lock arm 111 are arranged in nearly parallel to the vertical direction, and the gap therebetween is formed larger than the length of the engagement claw 31*g* in the short-side direction so as to fit the engagement claw 31*g* to between the pair of arms 111*b*. The lock arm 111 is configured to open in a U shape toward the vertical lower side (toward the lower-side opening 110*b*) because the shaft 111*a* thereof is arranged on the vertical upper side, and to allow the engagement claw 31*g* to be inserted into the gap between the pair of arms 111*b* from the vertical lower side. Similarly, the pair of arms 112*b* of the lock arm 112 are arranged in nearly parallel to the vertical direction, and the gap therebetween is formed larger than the length of the engagement claw 31*m* in the short-side direction so as to fit the engagement claw 31*m* to between the pair of arms 112*b*. The lock arm 112 is configured to open in a U shape toward the vertical upper side (toward the upper-side opening 110*a*) because the shaft 112*a* thereof is arranged on the vertical lower side, and to allow the engagement claw 31*m* to be inserted into the gap between the pair of arms 112*b* from the vertical upper side.

The lock arm 111 forms a rectangular-ring shape by the shaft 111*a*, the pair of arms 111*b*, and the short-side inner peripheral face 110*c*. As illustrated in FIGS. 13 and 14, the engagement claw 31*g* of the electronic component unit 1 is inserted into a central rectangular ring-shaped hole 111*c* of the lock arm 111, and a contact state with the shaft 111*a* is maintained, thereby causing the engagement claw 31*g* to be engaged with the lock arm 111. This engagement can prevent the electronic component unit 1 from escaping toward the upper-side opening 110*a*.

Similarly, the lock arm 112 forms a rectangular-ring shape by the shaft 112*a*, the pair of arms 112*b*, and the short-side inner peripheral face 110*c*. As illustrated in FIGS. 13 and 14, the engagement claw 31*m* of the electronic component unit 1 is inserted into a central rectangular ring-shaped hole 112*c* of the lock arm 112, and a contact state with the shaft 112*a* is maintained, thereby causing the engagement claw 31*m* to be engaged with the lock arm 112. This engagement can prevent the electronic component unit 1 from escaping toward the lower-side opening 110*b*.

As illustrated in FIGS. 12 through 14, in the present embodiment, with the electronic component unit 1 fitted to the electronic component unit housing part 110, the engagement claw 31*g* of the electronic component unit 1 is locked to the lock arm 111, whereas the engagement claw 31*m* is locked to the lock arm 112. This configuration can prevent the electronic component unit 1 from escaping toward both the upper-side opening 110*a* and the lower-side opening 110*b* of the electronic component unit housing part 110 and can favorably lock the electronic component unit 1 to the body 103 of the electrical connection box 100.

As illustrated in FIGS. 8 and 9, for example, on the short-side wall face 31*f* of the electronic component unit 1, a pair of guide members 31*n* are provided on the short-side both end sides of the two engagement claws 31*g*, 31*m*. As illustrated in FIG. 10 or the like, on the short-side inner peripheral face 110*c* of the electronic component unit housing part 110, guide receiving parts 110*e* are provided that are fitted to the guide members 31*n* when the electronic component unit 1 is fitted to the electronic component unit housing part 110. The guide members 31*n* are provided so as to extend to upper and lower positions than the vertical positions of the two engagement claws 31*g*, 31*m* provided on the same face. Because this configuration causes, when the electronic component unit 1 is fitted to the electronic component unit housing part 110 from the upper-side opening 110*a*, the guide members 31*n* to be fitted to the guide receiving parts 110*e* before the engagement claw 31*m* is engaged with the lock arm 112, the electronic component unit 1 can be easily positioned relative to the electronic component unit housing part 110. Similarly, also when the electronic component unit 1 is fitted to the electronic component unit housing part 110 from the lower-side opening 110*b*, because the guide members 31*n* are fitted to the guide receiving parts 110*e* before the engagement claw 31*g* is engaged with the lock arm 111, the electronic component unit 1 can be easily positioned relative to the electronic component unit housing part 110.

Figure 15:
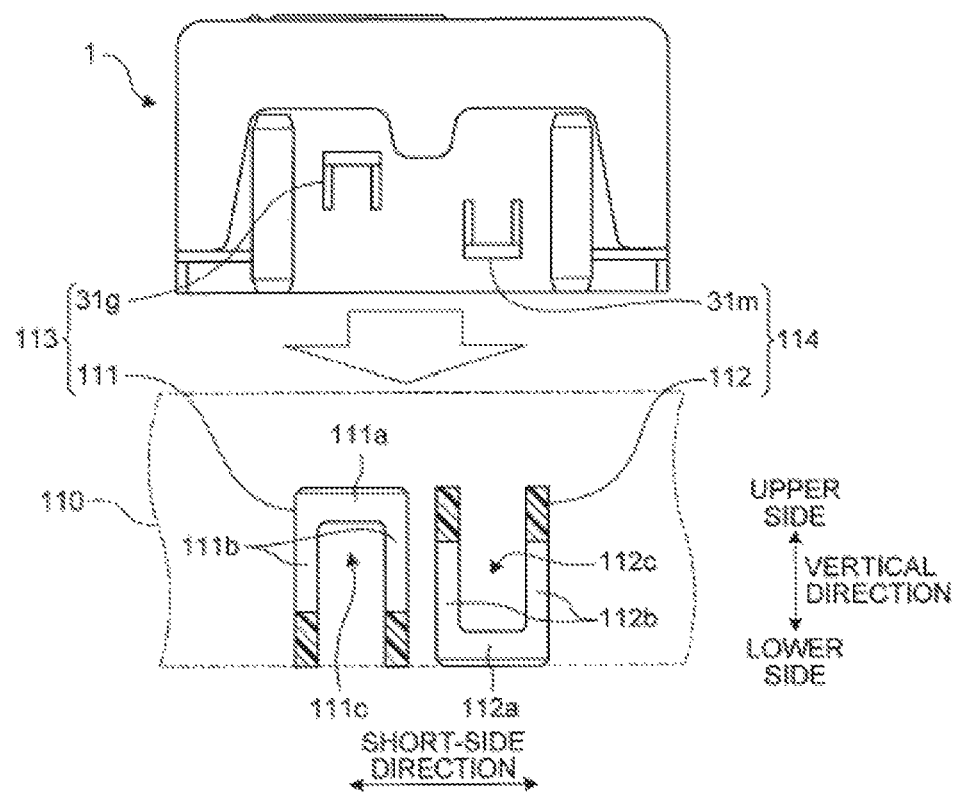
FIG. 15 is a schematic view illustrating a state in which the electronic component unit is approaching to an upper-side opening of the electronic component unit housing part from the vertical upper side.
Figure 16:
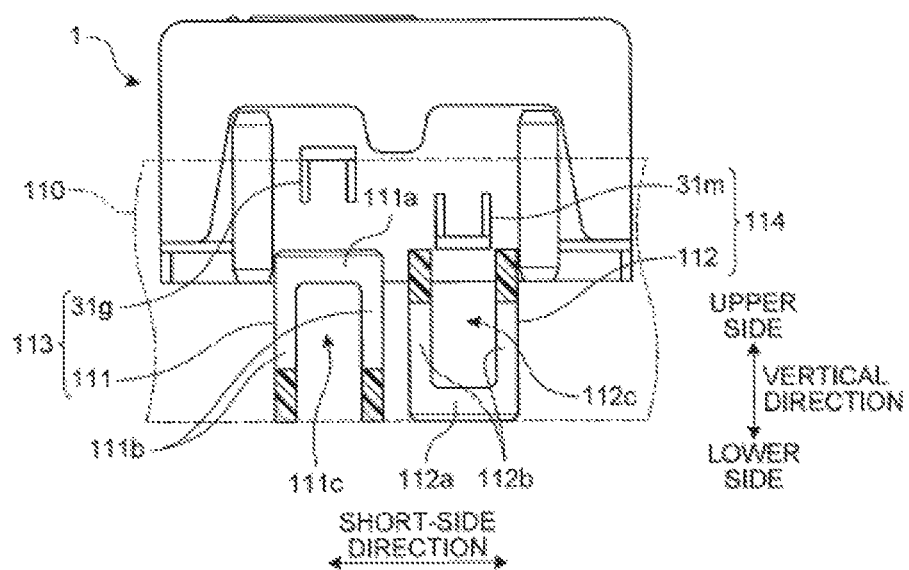
FIG. 16 is a schematic view illustrating a state in which an engagement claw 31*m* (a second engagement claw) of the electronic component unit is being inserted into a gap between arms of a lock arm 112 (a second lock arm) of the electronic component unit housing part from the vertical upper side.
Figure 17:
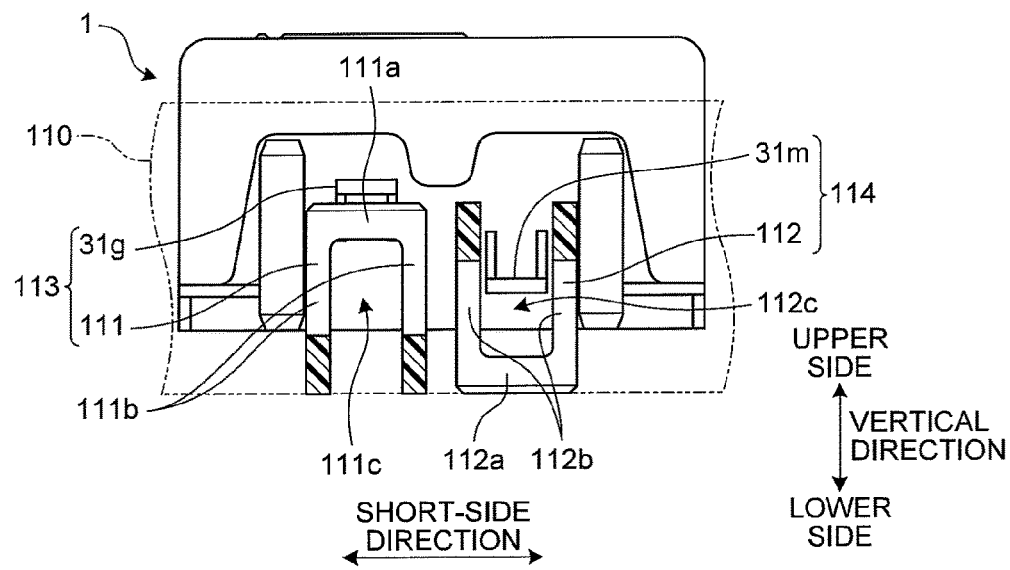
FIG. 17 is a schematic view illustrating a state in which an engagement claw 31*g* (a first engagement claw) of the electronic component unit is coming into contact with a shaft of a lock arm 111 (a first lock arm) of the electronic component unit housing part from the vertical upper side.
Figure 18:
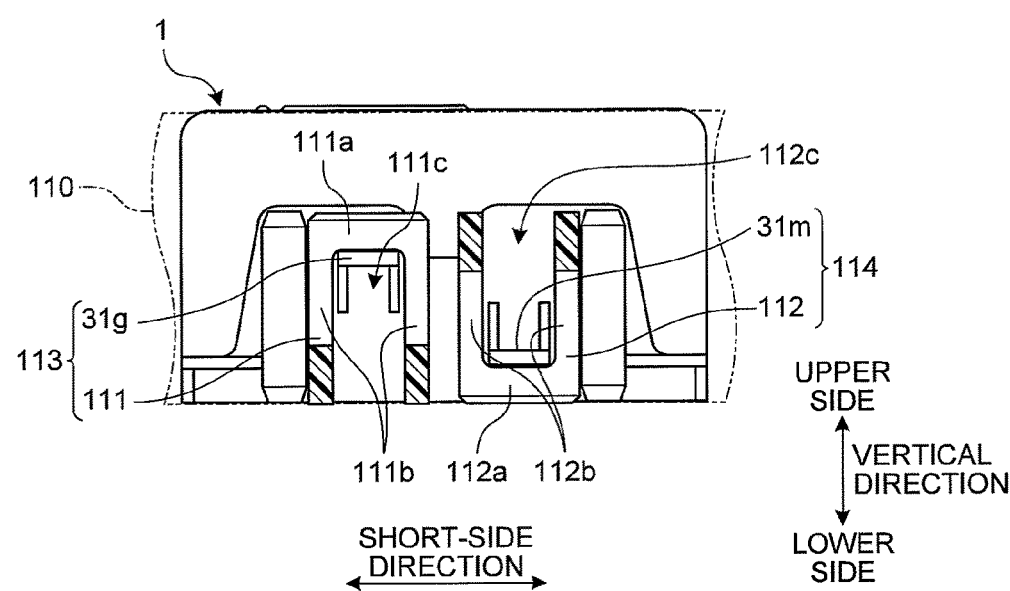
FIG. 18 is a schematic view illustrating a state in which the engagement claw 31*g* (the first engagement claw) of the electronic component unit is locked by the lock arm 111 (the first lock arm) of the electronic component unit housing part, and the electronic component unit is perfectly fitted to the electronic component unit housing part.

Described next with reference to FIGS. 15 through 18 is a locking operation by the lock mechanism between the electronic component unit 1 (the member to be supported) and the body 103 (the supporting body) of the electrical connection box 100 according to the present embodiment. Described as an example is a locking operation when the electronic component unit 1 is fitted to the electronic component unit housing part 110 of the body 103 of the electrical connection box 100 through the upper-side opening 110*a* from the vertical upper side (also expressed as "upper insertion fitting"). FIG. 15 is a schematic view illustrating a state in which the electronic component unit is approaching an upper-side opening of the electronic component unit housing part from the vertical upper side. FIG. 16 is a schematic view illustrating a state in which the engagement claw 31*m* (the second engagement claw) of the electronic component unit is being inserted into the gap between the arms of the lock arm 112 (the second lock arm) of the electronic component unit housing part from the vertical upper side. FIG. 17 is a schematic view illustrating a state in which the engagement claw 31*g* (the first engagement claw) of the electronic component unit is coming into contact with the shaft of the lock arm 111 (the first lock arm) of the electronic component unit housing part from the vertical upper side. FIG. 18 is a schematic view illustrating a state in which the engagement claw 31*g* (the first engagement claw) of the electronic component unit is locked by the lock arm 111 (the first lock arm) of the electronic component unit housing part, and the electronic component unit is perfectly fitted to the electronic component unit housing part. FIGS. 15 through 18 schematically illustrate the locking operation with the electronic component unit 1 when the short-side inner peripheral face 110*c* is viewed from the outer peripheral side; the illustration is viewed through the short-side inner peripheral face 110*c* in order to clarify relations between the engagement claws 31*g*, 31*m* and the lock arms 111, 112 during the locking operation.

As illustrated in FIG. 15, when the electronic component unit 1 approaches the upper-side opening 110*a* of the electronic component unit housing part 110 from the vertical upper side, as illustrated in FIG. 16, first, the engagement claw 31*m* of the electronic component unit 1 arranged on the vertical lower side comes into contact with the lock arm 112 of the electronic component unit housing part 110. The lock arm 112 with the shaft 112*a* arranged on the vertical lower side is configured to open in a U shape upward in the vertical direction, and to allow the engagement claw 31*m* to be inserted into the gap between the pair of arms 112*b* from the vertical upper side. The electronic component unit 1 therefore further advances downward while the engagement claw 31*m* is inserted into the gap between the pair of arms 112*b* of the lock arm 112. In other words, in the case of the upper insertion fitting, the engagement claw 31*m* of the electronic component unit 1 and the lock arm 112 of the electronic component unit housing part 110 function as a guide part for upper insertion fitting that guides the electronic component unit 1 to the fitting direction.

As illustrated in FIG. 17, when the fitting of the electronic component unit 1 is further advanced, the engagement claw 31g of the electronic component unit 1 comes into contact with the lock arm 111 of the electronic component unit housing part 110. In the lock arm 111, the shaft 111a is arranged on the vertical upper side, and in this situation the engagement claw 31g of the electronic component unit 1 comes into contact with the shaft 111a of the lock arm 111 from the vertical upper side. This operation causes the engagement claw 31g to hook on to the shaft 111a, thereby once restricting the advancement of the electronic component unit 1 in the fitting direction.

When an external force is applied to the electronic component unit 1 from the vertical upper side, the lock arm 111 becomes elastically deformed in a direction (in the viewer's side of FIGS. 15 through 18) in which the shaft 111a approaches the short-side inner peripheral face 110c, because the lock arm 111 of the electronic component unit housing part 110 is formed of resin. This deformation clears the shaft 111a from the advancement direction of the engagement claw 31g, and the advancement of the electronic component unit 1 in the fitting direction is resumed. As illustrated in FIG. 18, when the engagement claw 31g advances to the vertical lower side than the shaft 111a, the lock arm 111 elastically restores the original shape, the engagement claw 31g of the electronic component unit 1 is inserted into the hole 111c of the lock arm 111, and a state is achieved in which the engagement claw 31g is properly fitted to the lock arm 111. In other words, in the case of the upper insertion fitting, the engagement claw 31g of the electronic component unit 1 and the lock arm 111 of the electronic component unit housing part 110 function as a lock mechanism 113 for upper insertion fitting (a first lock mechanism) that locks the electronic component unit 1 to the electronic component unit housing part 110.

As illustrated in FIG. 18, when the engagement claw 31g is engaged with the lock arm 111, the engagement claw 31m inserted into the gap between the pair of arms 112b of the lock arm 112 hits the shaft 112a of the lock arm 112 and is restricted to advance further. Consequently, the electronic component unit 1 is prevented from escaping toward both the upper-side opening 110a and the lower-side opening 110b of the electronic component unit housing part 110, achieving a state in which the electronic component unit 1 is perfectly locked to the body 103 of the electrical connection box 100 (the state illustrated in FIGS. 12 through 14).

In contrast to FIGS. 15 through 18, in a locking operation when the electronic component unit 1 is fitted to the electronic component unit housing part 110 of the body 103 of the electrical connection box 100 through the lower-side opening 110b from the vertical lower side (also expressed as "lower insertion fitting"), the same final locked state between the electronic component unit 1 and the body 103 of the electrical connection box 100 is obtained, only with the function by the engagement claw 31g of the electronic component unit 1 and the lock arm 111 of the electronic component unit housing part 110 and the function by the engagement claw 31m of the electronic component unit 1 and the lock arm 112 of the electronic component unit housing part 110 reversed. In other words, in the case of the lower insertion fitting, the engagement claw 31g of the electronic component unit 1 and the lock arm 111 of the electronic component unit housing part 110 function as a guide part for lower insertion fitting that guides the electronic component unit 1 to the fitting direction, whereas the engagement claw 31m and the lock arm 112 function as a lock mechanism 114 for lower insertion fitting (a second lock mechanism) that locks the electronic component unit 1 to the electronic component unit housing part 110.

Described next are effects of the lock mechanism between the electronic component unit 1 (the member to be supported) and the body 103 (the supporting body) of the electrical connection box 100 according to the present embodiment.

The lock mechanism of the present embodiment includes the electronic component unit 1, the body 103 (the electronic component unit housing part 110) of the electrical connection box 100 that includes the upper-side opening 110a and the lower-side opening 110b provided on respective both ends in the vertical direction as the predetermined fitting direction and can fit the electronic component unit 1 along the fitting direction from the upper-side opening 110a and the lower-side opening 110b, the lock mechanism 113 for upper insertion fitting (the engagement claw 31g and the lock arm 111) that, when the electronic component unit 1 is fitted to the electronic component unit housing part 110 from the upper-side opening 110a, locks the electronic component unit 1 to the electronic component unit housing part 110 to prevent the electronic component unit 1 from escaping toward the upper-side opening 110a, and the lock mechanism 114 for lower insertion fitting (the engagement claw 31m and the lock arm 112) that, when the electronic component unit 1 is fitted to the electronic component unit housing part 110 from the lower-side opening 110b, locks the electronic component unit 1 to the electronic component unit housing part 110 to prevent the electronic component unit 1 from escaping toward the lower-side opening 110b. The lock mechanism 113 for upper insertion fitting functions as the guide part that guides the electronic component unit 1 to the fitting direction in the case of the lower insertion fitting, in which the electronic component unit 1 is fitted to the electronic component unit housing part 110 from the lower-side opening 110b. The lock mechanism 114 for lower insertion fitting functions as the guide part that guides the electronic component unit 1 to the fitting direction in the case of the upper insertion fitting, in which the electronic component unit 1 is fitted to the electronic component unit housing part 110 from the upper-side opening 110a.

With this configuration, the electronic component unit 1 can be fitted to the electronic component unit housing part 110 of the electrical connection box 100 for the pieces of fitting from two directions including the vertical upper side and lower side, that is, the upper insertion fitting, in which the electronic component unit 1 is fitted to the electronic component unit housing part 110 from the upper-side opening 110a and the lower insertion fitting, in which the electronic component unit 1 is fitted to the electronic component unit housing part 110 from the lower-side opening 110b. The lock mechanism 113 for upper insertion fitting functions as the guide part in the case of the lower insertion fitting. Similarly, the lock mechanism 114 for lower insertion fitting functions as the guide part in the case of the upper insertion fitting. With this configuration, when fitting in one direction is performed, the other lock mechanism, which is not used as a lock mechanism, does not serve as a hindrance and can, on the contrary, facilitate the fitting operation of the electronic component unit 1. This operation can improve the mounting workability of the electronic component unit 1 relative to the body 103 (the electronic component unit housing part 110) of the electrical connection box 100.

In the lock mechanism of the present embodiment, the electronic component unit 1 includes the pair of short-side wall faces 31f, whereas the electronic component unit housing part 110 includes the pair of short-side inner peripheral faces 110c arranged on the outer peripheral side of the pair of short-side wall faces 31f when the electronic component unit 1 is fitted. The lock mechanism 113 for upper insertion fitting (the engagement claw 31g and the lock arm 111) is provided in between one surface of the pair of short-side wall faces 31f of the electronic component unit 1 and the short-side inner peripheral face 110c facing the one surface. The lock mechanism 114 for lower insertion fitting (the engagement claw 31m and the lock arm 112) is provided in between the short-side wall face 31f and the short-side inner peripheral face 110c different from the short-side wall face 31f and the short-side inner peripheral face 110c for the lock mechanism 113 for upper insertion fitting. In other words, the lock mechanism 113 for upper insertion fitting and the lock mechanism 114 for lower insertion fitting in pairs are oppositely arranged when the electronic component unit 1 is fitted to the electronic component unit housing part 110.

With this configuration, the lock mechanism 113 for upper insertion fitting and the lock mechanism 114 for lower insertion fitting are oppositely arranged along the long-side direction, and when the electronic component unit 1 is fitted to the body 103 of the electrical connection box 100, the electronic component unit 1 can be easily positioned relative to the electronic component unit housing part 110 in the long-side direction and the short-side direction.

In the lock mechanism of the present embodiment, another lock mechanism 114 for lower insertion fitting is provided in between the short-side wall face 31f and the short-side inner peripheral face 110c in between which the above lock mechanism 113 for upper insertion fitting is provided. Another lock mechanism 113 for upper insertion fitting is provided in between the short-side wall face 31f and the short-side inner peripheral face 110c in between which the above lock mechanism 114 for lower insertion fitting is provided.

With this configuration, the lock mechanism 113 for upper insertion fitting and the lock mechanism 114 for lower insertion fitting are arranged at extremely close positions in between the short-side wall face 31f and the short-side inner peripheral face 110c that are in mutual contact when the electronic component unit 1 is fitted to the electronic component unit housing part 110. With this configuration, movement in the vertical direction can be favorably restricted between the short-side wall face 31f and the short-side inner peripheral face 110c, and a locked state of the electronic component unit 1 can be favorably maintained against vibration of the vehicle or the electrical connection box 100. The lock mechanism 113 for upper insertion fitting and the lock mechanism 114 for lower insertion fitting are arranged in parallel in the short-side direction, and the vertical dimensions of the electronic component unit 1 and the electronic component unit housing part 110 can be reduced. Both the lock mechanism 113 for upper insertion fitting and the lock mechanism 114 for lower insertion fitting are provided in between each of the two pairs of the short-side wall face 31f and the short-side inner peripheral face 110c oppositely arranged in the long-side direction, which can further increase vibration resistance. The guide parts are provided in plurality, which can further facilitate the positioning of the electronic component unit 1 relative to the electronic component unit housing part 110 in the long-side direction and the short-side direction.

In the lock mechanism of the present embodiment, the lock mechanism 113 for upper insertion fitting includes the engagement claw 31g provided on the electronic component unit 1, and the lock arm 111 that is provided on the body 103 (the electronic component unit housing part 110) of the electrical connection box 100 and, when the electronic component unit 1 is fitted to the electronic component unit housing part 110, locks the engagement claw 31g to prevent the engagement claw 31g from escaping toward the upper-side opening 110a. The lock mechanism 114 for lower insertion fitting includes the engagement claw 31m provided on the electronic component unit 1, and the lock arm 112 that is provided on the electronic component unit housing part 110 and, when the electronic component unit 1 is fitted to the electronic component unit housing part 110, locks the engagement claw 31m to prevent the engagement claw 31m from escaping toward the lower-side opening 110b. The lock arm 111, when the electronic component unit 1 is fitted to the electronic component unit housing part 110 from the lower-side opening 110b, functions as the guide part that guides the engagement claw 31g to the fitting direction. The lock arm 112, when the electronic component unit 1 is fitted to the electronic component unit housing part 110 from the upper-side opening 110a, functions as the guide part that guides the engagement claw 31m to the fitting direction.

With this configuration, the pairs of the engagement claws 31g, 31m and the lock arms 111, 112 can favorably exhibit the functions of the lock mechanism and the guide part. When the electronic component unit 1 is fitted to the electronic component unit housing part 110, the engagement claws 31g, 31m are not coupled to the lock arms 111, 112, respectively, in parallel therewith, but are engaged with the central rectangular ring-shaped holes 111c, 112c of the lock arms 111, 112, respectively. In other words, the engagement claws 31g, 31m are superimposed on the lock arms 111, 112, respectively, in a plan view of the short-side wall face 31f and the short-side inner peripheral face 110c. This configuration can achieve further reduction in the vertical dimensions of the electronic component unit 1 and the electronic component unit housing part 110.

In the lock mechanism of the present embodiment, the lock arm 111 includes the shaft 111a, and the pair of arms 111b that are connected to both ends of the shaft 111a and extend from the shaft 111a toward the lower-side opening 110b, whereas the lock arm 112 includes the shaft 112a, and the pair of arms 112b that are connected to both ends of the shaft 112a and extend from the shaft 112a toward the upper-side opening 110a.

With this configuration, the lock arm 111 is configured to open in a U shape toward the vertical lower side (toward the lower-side opening 110b), and to allow the engagement claw 31g to be inserted into the gap between the pair of arms 111b from the vertical lower side. The lock arm 112 is configured to open in a U shape toward the vertical upper side (toward the upper-side opening 110a), and to allow the engagement claw 31m to be inserted into the gap between the pair of arms 112b from the vertical upper side. With this configuration, when the electronic component unit 1 is fitted to the electronic component unit housing part 110 from the lower-side opening 110b, the engagement claw 31g is inserted into the gap between the pair of arms 111b of the lock arm 111, thereby enabling the electronic component unit 1 to be favorably guided to the fitting direction. Similarly, when the electronic component unit 1 is fitted to the electronic component unit housing part 110 from the upper-side opening 110a, the engagement claw 31m is inserted into the gap between the pair of arms 112b of the lock arm 112, thereby enabling the electronic component unit 1 to be favorably guided to the fitting direction.

The above embodiment describes the locking structure between the electronic component unit 1 (the member to be supported) and the body 103 (the supporting body) of the electrical connection box 100. The present invention can also be applied to a structure that locks a member to be supported other than the electronic component unit 1 to a supporting body other than the body 103 of the electrical connection box 100.

The above embodiment exemplifies a configuration that provides the engagement claws 31g, 31m on the pair of short-side wall faces 31f of the electronic component unit 1 and provides the lock arms 111, 112 on the pair of short-side inner peripheral faces 110c of the electronic component unit housing part 110. Instead, another possible configuration may provide the lock arms 111, 112 on the electronic component unit 1 side and the engagement claws 31g, 31m on the electronic component unit housing part 110 side. At least one of the engagement claws 31g, 31m on the pair of short-side wall faces 31f may be moved to the long-side wall faces 31c. At least one of the lock arms 111, 112 on the pair of short-side inner peripheral faces 110c may be moved to the long-side inner peripheral faces 110d.

The above embodiment exemplifies a configuration that provides the engagement claws 31g, 31m on the pair of short-side wall faces 31f of the electronic component unit 1 and the lock arms 111, 112 on the pair of short-side inner peripheral faces 110c of the electronic component unit housing part 110. In addition thereto, the engagement claws 31g, 31m may further be provided on the pair of long-side wall faces 31c of the electronic component unit 1, whereas the lock arms 111, 112 may further be provided on the pair of long-side inner peripheral faces 110d of the electronic component unit housing part 110.

Another possible configuration may provide only the engagement claw 31g on one of the pair of short-side wall faces 31f, provide only the engagement claw 31m on the other of the short-side wall faces 31f, provide only the lock arm 111 on one of the pair of short-side inner peripheral faces 110c, and provide only the lock arm 112 on the other of the short-side inner peripheral faces 110c.

Another possible configuration may provide the engagement claws 31g, 31m only on one face of the pair of short-side wall faces 31f of the electronic component unit 1 and provide the lock arms 111, 112 only on one face of the pair of short-side inner peripheral faces 110c of the electronic component unit housing part 110 facing the above one face.

The locking structure between a member to be supported and a supporting body according to the present invention produces an effect of improving the mounting workability of the member to be supported relative to the supporting body.

Although the embodiment of the present invention has been described, the embodiment is presented as an example and has no intention of limiting the scope of the invention. The above embodiment can be embodied in other various forms, and various omissions, substitutions, or changes can be made thereto without departing from the essence of the invention. The above embodiment and modifications thereof are included in the scope and essence of the invention, and similarly, included in the inventions described in the claims and the scope of equivalents thereof.

What is claimed is:

1. A locking structure between a member to be supported and a supporting body, the locking structure comprising:
   a member to be supported;
   a supporting body with a first opening and a second opening provided on opposite sides of the supporting body in a predetermined fitting direction, and configured to be able to fit the member to be supported along the fitting direction from the first opening and the second opening;
   a first lock mechanism configured to lock the member to be supported to the supporting body to prevent the member to be supported from escaping toward the first opening, when the member to be supported is fitted to the supporting body from the first opening; and
   a second lock mechanism configured to lock the member to be supported to the supporting body to prevent the member to be supported from escaping toward the second opening, when the member to be supported is fitted to the supporting body from the second opening, wherein
   the first lock mechanism is configured to function as a guide part that guides the member to be supported to the fitting direction, when the member to be supported is fitted to the supporting body from the second opening, and
   the second lock mechanism is configured to function as a guide part that guides the member to be supported to the fitting direction, when the member to be supported is fitted to the supporting body from the first opening.

2. The locking structure between a member to be supported and a supporting body according to claim 1, wherein
   the member to be supported has a plurality of outer peripheral faces,
   the supporting body has a plurality of inner peripheral faces arranged facing the outer peripheral faces when the member to be supported is fitted,
   the first lock mechanism is provided in between a first outer peripheral face of the plurality of outer peripheral faces of the member to be supported, and an inner peripheral face facing the first outer peripheral face, and
   the second lock mechanism is provided in between a second outer peripheral face of the plurality of outer peripheral faces of the member to be supported, and an inner peripheral face facing the second outer peripheral face.

3. The locking structure between a member to be supported and a supporting body according to claim 2, wherein
   the first lock mechanism is oriented in a first direction, and the second lock mechanism is oriented in a second direction opposite to the first direction when the member to be supported is fitted to the supporting body.

4. The locking structure between a member to be supported and a supporting body according to claim 3, wherein
   another second lock mechanism different from the second lock mechanism is provided in between the first outer peripheral face and the inner peripheral face in between which the first lock mechanism is provided, and
   another first lock mechanism different from the first lock mechanism is provided in between the second outer peripheral face and the inner peripheral face in between which the second lock mechanism is provided.

5. The locking structure between a member to be supported and a supporting body according to claim 4, wherein
   the first lock mechanism includes
   a first engagement claw provided on one of the member to be supported and the supporting body, and
   a first lock arm that is provided on the other of the member to be supported and the supporting body, and locks the first engagement claw to prevent the first engagement claw from escaping toward the first opening, when the member to be supported is fitted to the supporting body, the second lock mechanism includes
a second engagement claw provided on one of the member to be supported and the supporting body, and
a second lock arm that is provided on the other of the member to be supported and the supporting body, and locks the second engagement claw to prevent the second engagement claw from escaping toward the second opening, when the member to be supported is fitted to the supporting body,
the first lock arm is configured to function as a guide part that guides the first engagement claw to the fitting direction, when the member to be supported is fitted to the supporting body from the second opening, and
the second lock arm is configured to function as a guide part that guides the second engagement claw to the fitting direction, when the member to be supported is fitted to the supporting body from the first opening.

6. The locking structure between a member to be supported and a supporting body according to claim 3, wherein
the first lock mechanism includes
a first engagement claw provided on one of the member to be supported and the supporting body, and
a first lock arm that is provided on the other of the member to be supported and the supporting body, and locks the first engagement claw to prevent the first engagement claw from escaping toward the first opening, when the member to be supported is fitted to the supporting body,
the second lock mechanism includes
a second engagement claw provided on one of the member to be supported and the supporting body, and
a second lock arm that is provided on the other of the member to be supported and the supporting body, and locks the second engagement claw to prevent the second engagement claw from escaping toward the second opening, when the member to be supported is fitted to the supporting body,
the first lock arm is configured to function as a guide part that guides the first engagement claw to the fitting direction, when the member to be supported is fitted to the supporting body from the second opening, and
the second lock arm is configured to function as a guide part that guides the second engagement claw to the fitting direction, when the member to be supported is fitted to the supporting body from the first opening.

7. The locking structure between a member to be supported and a supporting body according to claim 2, wherein
the first lock mechanism includes
a first engagement claw provided on one of the member to be supported and the supporting body, and
a first lock arm that is provided on the other of the member to be supported and the supporting body, and locks the first engagement claw to prevent the first engagement claw from escaping toward the first opening, when the member to be supported is fitted to the supporting body,
the second lock mechanism includes
a second engagement claw provided on one of the member to be supported and the supporting body, and
a second lock arm that is provided on the other of the member to be supported and the supporting body, and locks the second engagement claw to prevent the second engagement claw from escaping toward the second opening, when the member to be supported is fitted to the supporting body,
the first lock arm is configured to function as a guide part that guides the first engagement claw to the fitting direction, when the member to be supported is fitted to the supporting body from the second opening, and
the second lock arm is configured to function as a guide part that guides the second engagement claw to the fitting direction, when the member to be supported is fitted to the supporting body from the first opening.

8. The locking structure between a member to be supported and a supporting body according to claim 1, wherein
the member to be supported has a plurality of outer peripheral faces,
the supporting body has a plurality of inner peripheral faces arranged facing the outer peripheral faces when the member to be supported is fitted, and
the first lock mechanism and the second lock mechanism are provided in between one outer peripheral face of the outer peripheral faces of the member to be supported and an inner peripheral face facing the one outer peripheral face.

9. The locking structure between a member to be supported and a supporting body according to claim 8, wherein
the first lock mechanism includes
a first engagement claw provided on one of the member to be supported and the supporting body, and
a first lock arm that is provided on the other of the member to be supported and the supporting body, and locks the first engagement claw to prevent the first engagement claw from escaping toward the first opening, when the member to be supported is fitted to the supporting body,
the second lock mechanism includes
a second engagement claw provided on one of the member to be supported and the supporting body, and
a second lock arm that is provided on the other of the member to be supported and the supporting body, and locks the second engagement claw to prevent the second engagement claw from escaping toward the second opening, when the member to be supported is fitted to the supporting body,
the first lock arm is configured to function as a guide part that guides the first engagement claw to the fitting direction, when the member to be supported is fitted to the supporting body from the second opening, and
the second lock arm is configured to function as a guide part that guides the second engagement claw to the fitting direction, when the member to be supported is fitted to the supporting body from the first opening.

10. The locking structure between a member to be supported and a supporting body according to claim 1, wherein
the first lock mechanism includes
a first engagement claw provided on one of the member to be supported and the supporting body, and
a first lock arm that is provided on the other of the member to be supported and the supporting body, and locks the first engagement claw to prevent the first engagement claw from escaping toward the first opening, when the member to be supported is fitted to the supporting body,
the second lock mechanism includes
a second engagement claw provided on one of the member to be supported and the supporting body, and
a second lock arm that is provided on the other of the member to be supported and the supporting body, and locks the second engagement claw to prevent the second engagement claw from escaping toward the second opening, when the member to be supported is fitted to the supporting body,
the first lock arm is configured to function as a guide part that guides the first engagement claw to the fitting direction, when the member to be supported is fitted to the supporting body from the second opening, and the second lock arm is configured to function as a guide part that guides the second engagement claw to the fitting direction, when the member to be supported is fitted to the supporting body from the first opening.

11. The locking structure between a member to be supported and a supporting body according to claim 10, wherein
the first lock arm includes
a first shaft, and
a pair of first arms that are connected to both ends of the first shaft and extend from the first shaft toward the second opening, and
the second lock arm includes
a second shaft, and
a pair of second arms that are connected to both ends of the second shaft and extend from the second shaft toward the first opening.

\* \* \* \* \*